United States Patent
Maejima

(10) Patent No.: US 7,400,534 B2
(45) Date of Patent: Jul. 15, 2008

(54) NAND FLASH MEMORY AND DATA PROGRAMMING METHOD THEREOF

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/833,051

(22) Filed: Aug. 2, 2007

(65) Prior Publication Data

US 2007/0297233 A1 Dec. 27, 2007

Related U.S. Application Data

(63) Continuation of application No. PCT/IB2005/002921, filed on Sep. 30, 2005.

(30) Foreign Application Priority Data

Feb. 3, 2005 (JP) .............................. 2005-027846

(51) Int. Cl.
*G11C 16/04* (2006.01)

(52) U.S. Cl. .......................... 365/185.17; 365/185.06; 365/185.12; 365/238.5; 365/230.08

(58) Field of Classification Search ............ 365/185.17, 365/185.05, 185.12, 238.5, 230.08
See application file for complete search history.

(56) References Cited

U.S. PATENT DOCUMENTS

| | | | |
|---|---|---|---|
| 5,923,587 A | 7/1999 | Choi et al. | |
| 6,058,042 A | 5/2000 | Nobukata et al. | |
| 6,353,242 B1 | 3/2002 | Watanabe et al. | |
| 6,704,239 B2 * | 3/2004 | Cho et al. | 365/230.04 |
| 7,245,528 B2 * | 7/2007 | Shibata et al. | 365/185.03 |
| 2002/0117756 A1 | 8/2002 | Yamashita | |
| 2005/0259466 A1 * | 11/2005 | Kim | 365/185.05 |
| 2007/0133287 A1 * | 6/2007 | Hosono | 365/185.17 |

FOREIGN PATENT DOCUMENTS

| | | |
|---|---|---|
| EP | 1 349 214 A1 | 10/2003 |
| JP | 8-195393 | 7/1996 |
| JP | 2000-91546 | 3/2000 |

OTHER PUBLICATIONS

Ken Takeuchi, et al., "A Source-line Programming Scheme for Low Voltage Operation NAND Flash Memories", Symposium on VLSI Circuits Digest of Technical Papers, pp. 37-38, Jun. 1999.
Ken Takeuchi, et al., "A Double-Level Vth Select Gate Array Architecture for Multi-Level NAND Flash Memories", Symposium on VLSI Circuits Digest of Technical Papers, pp. 69-70, Jun. 1995.

* cited by examiner

*Primary Examiner*—Richard T. Elms
*Assistant Examiner*—Eric Wendler
(74) *Attorney, Agent, or Firm*—Oblon, Spivak, McClelland, Maier, P.C.

(57) ABSTRACT

A semiconductor integrated circuit device includes even-numbered bit lines, odd-numbered bit lines, cell source lines, first memory elements electrically connected between the even-numbered bit lines and the cell source lines, and second memory elements electrically connected between the odd-numbered bit lines and the cell source lines and belonging to the same rows as the first memory elements. A potential corresponding to data to be programmed is applied to the first memory element via the even-numbered bit line and a potential which suppresses programming is applied to the second memory element via the cell source line while the odd-numbered bit lines are kept in an electrically floating state when data is programmed into the first memory element.

20 Claims, 28 Drawing Sheets

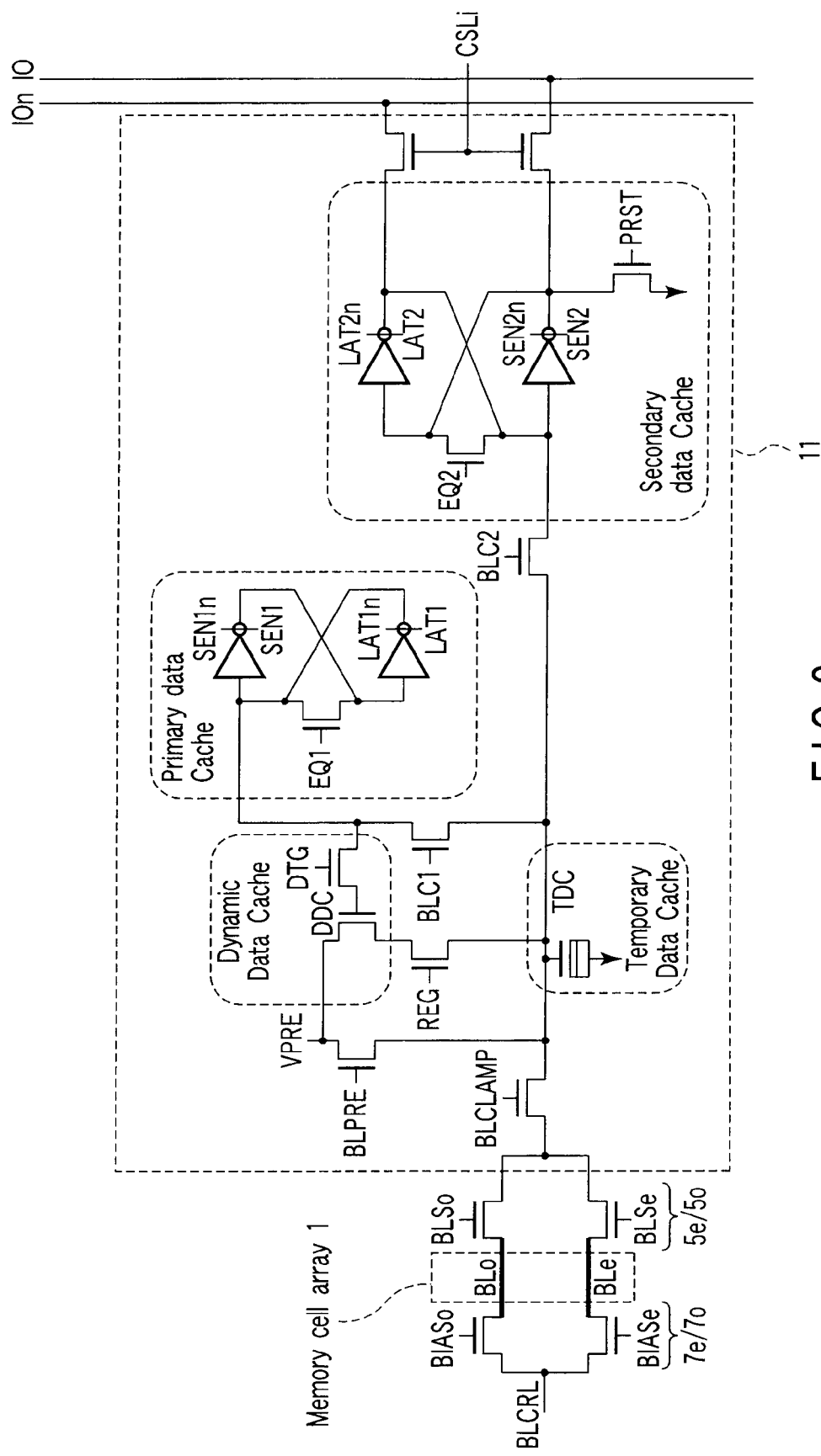
F I G. 2

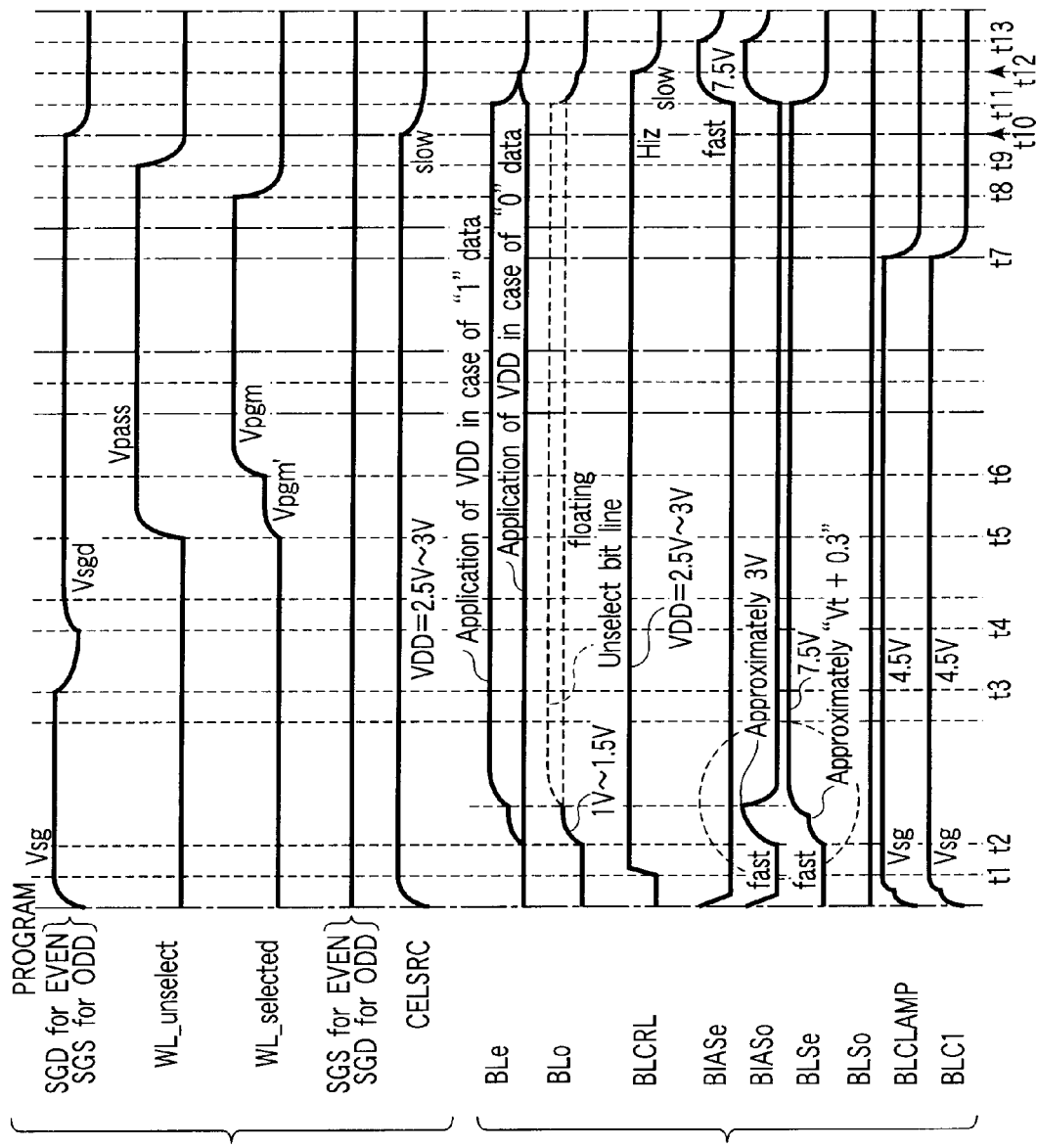
F I G. 7

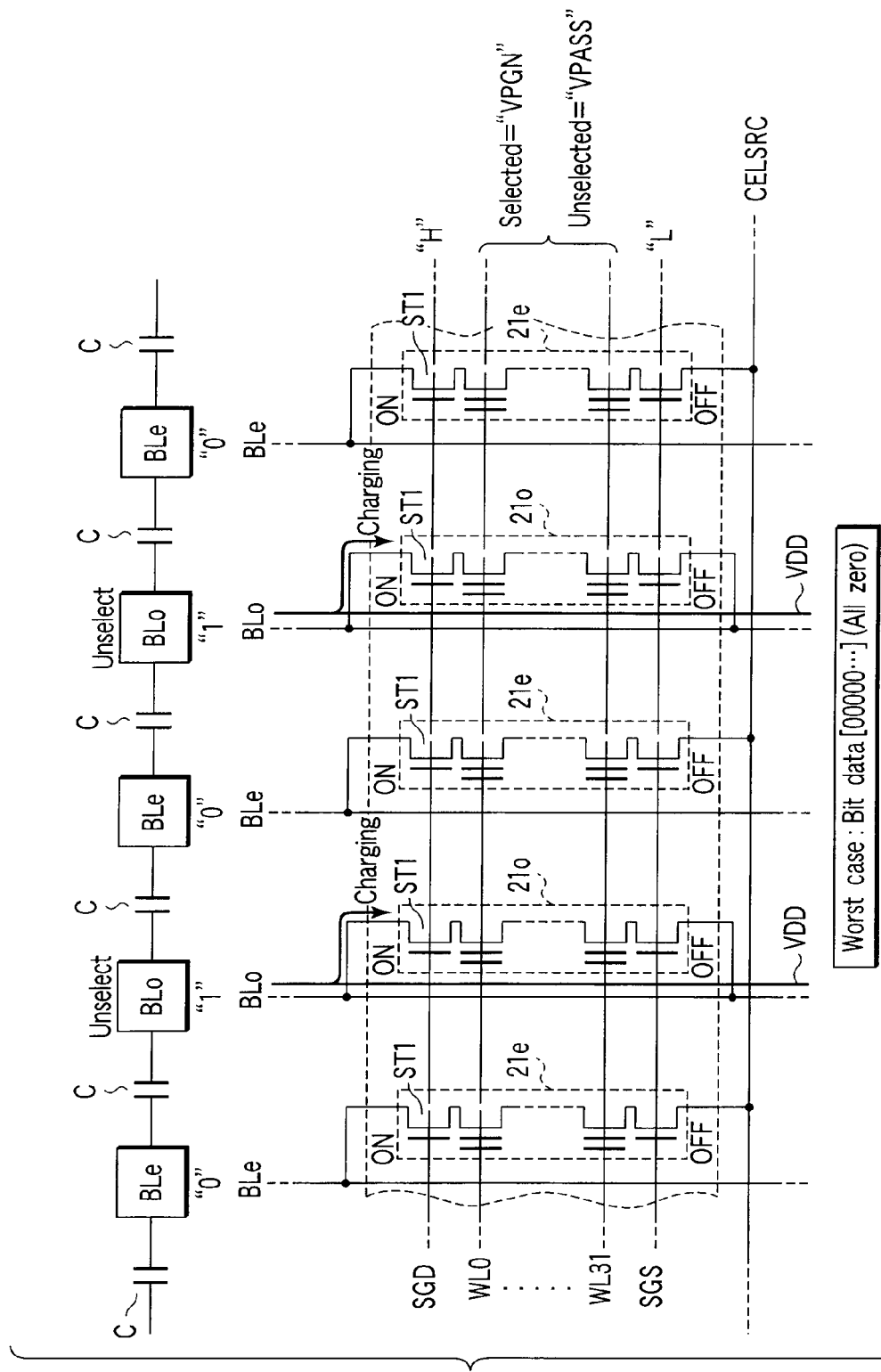
F I G. 9

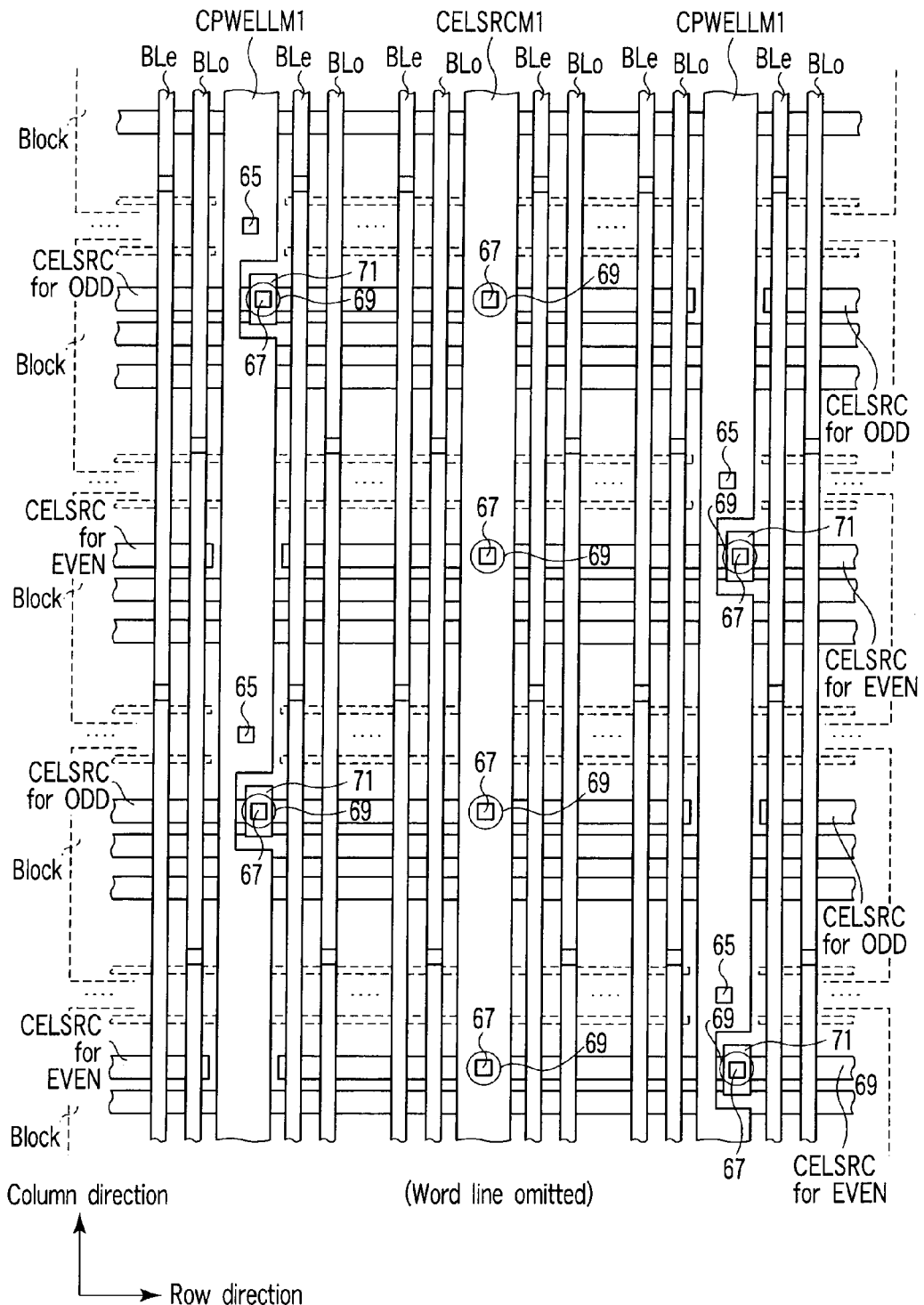
F I G. 26

NAND FLASH MEMORY AND DATA PROGRAMMING METHOD THEREOF

CROSS-REFERENCE TO RELATED APPLICATIONS

This is a Continuation Application of PCT Application No. PCT/IB2005/002921, filed Sep. 30, 2005, which was published under PCT Article 21(2) in English.

This application is based upon and claims the benefit of priority from prior Japanese Patent Application No. 2005-027846, filed Feb. 3, 2005, the entire contents of which are incorporated herein by reference.

BACKGROUND OF THE INVENTION

1. Field of the Invention

This invention relates to a semiconductor integrated circuit device and a data programming method thereof.

2. Description of the Related Art

The memory capacity of a nonvolatile semiconductor memory device, particularly, a NAND-type flash memory has become markedly increased. With the increase in memory capacity, memory cells and transistors in a peripheral circuit of the memory are further miniaturized. One typical example of a NAND-type flash memory having large-scale memory capacity is disclosed in Jpn. Pat. Appln. KOKAI Publication No. 2000-91546 (corresponding to U.S. Pat. No. 6,353,242), for example.

However, even if the memory cells and transistors are miniaturized, it is difficult to reduce the size of a memory cell array since the memory capacity is large. That is, it is difficult to reduce the length of the bit lines. In practice, the length of the bit lines tends to become greater. In spite of the present condition, the arrangement pitch of bit lines becomes narrow with increasing miniaturization of the memory cells and transistors. For this reason, the bit line capacitance tends to rapidly increase because of the bit line structure.

If the bit line capacitance rapidly increases, much attention must be paid to an increase in the bit line precharge period during data programming.

If the present condition becomes even more severe, it may become a bottleneck in the performance, particularly, in the high-speed operation of semiconductor memories.

BRIEF SUMMARY OF THE INVENTION

A semiconductor integrated circuit device according to a first aspect of the present invention comprises even-numbered bit lines, odd-numbered bit lines, cell source lines, first memory elements electrically connected between the even-numbered bit lines and the cell source lines, and second memory elements electrically connected between the odd-numbered bit lines and the cell source lines and belonging to the same rows as the first memory elements wherein a potential corresponding to data to be programmed is applied to the first memory element via the even-numbered bit line and a potential which suppresses programming is applied to the second memory elements via the cell source lines while the odd-numbered bit lines are kept in an electrically floating state when data is programmed into the first memory element, and a potential corresponding to data to be programmed is applied to the second memory element via the odd-numbered bit line and a potential which suppresses programming is applied to the first memory elements via the cell source lines while the even-numbered bit lines are kept in an electrically floating state when data is programmed into the second memory element.

A semiconductor integrated circuit device according to a second aspect of the present invention comprises even-numbered bit lines, odd-numbered bit lines, a page buffer, a first selection switch circuit which selectively electrically connects the page buffer to one of the even-numbered bit lines and odd-numbered bit lines, a second selection switch circuit which sets one of the even-numbered bit lines and odd-numbered bit lines into an electrically floating state, cell source lines, a cell source line driving circuit which drives the cell source lines by use of different potentials at programming time and read time, first memory elements connected between the even-numbered bit lines and the cell source lines, and second memory elements connected between the odd-numbered bit lines and the cell source lines and belonging to the same rows as the first memory elements.

A data programming method according to a third aspect of the present invention for a semiconductor integrated circuit device which includes even-numbered bit lines, odd-numbered bit lines, cell source lines, first memory elements electrically connected between the even-numbered bit lines and the cell source lines, and second memory elements electrically connected between the odd-numbered bit lines and the cell source lines and belonging to the same rows as the first memory elements, comprises applying a potential corresponding to data to be programmed to the first memory element via the even-numbered bit line and applying a potential which suppresses programming to the second memory element via the cell source line while the odd-numbered bit lines are kept in an electrically floating state when data is programmed into the first memory element, and applying a potential corresponding to data to be programmed to the second memory element via the odd-numbered bit line and applying a potential which suppresses programming to the first memory element via the cell source line while the even-numbered bit lines are kept in an electrically floating state when data is programmed into the second memory element.

BRIEF DESCRIPTION OF THE SEVERAL VIEWS OF THE DRAWING

FIG. 2 is a circuit diagram showing one example of a circuit of one column;

FIG. 7 is a waveform diagram showing one operation example of the semiconductor integrated circuit device according to the second embodiment;

FIG. 9 is a diagram (BLe selected) showing a comparison example;

FIG. 26 is a plan view showing an M1 layout example of a semiconductor integrated circuit device according to a fifth embodiment of this invention;

DETAILED DESCRIPTION OF THE INVENTION

In a semiconductor integrated circuit device according to embodiments of this invention, an increase in bit line precharge time during data programming is roughly coped with by setting the bit lines lying on both sides of a selected bit line into an electrically floating state during data programming.

There will now be described the embodiments of this invention with reference to the accompanying drawings. In this explanation, common reference symbols are attached to like portions throughout the drawings.

First Embodiment

Figure 1:
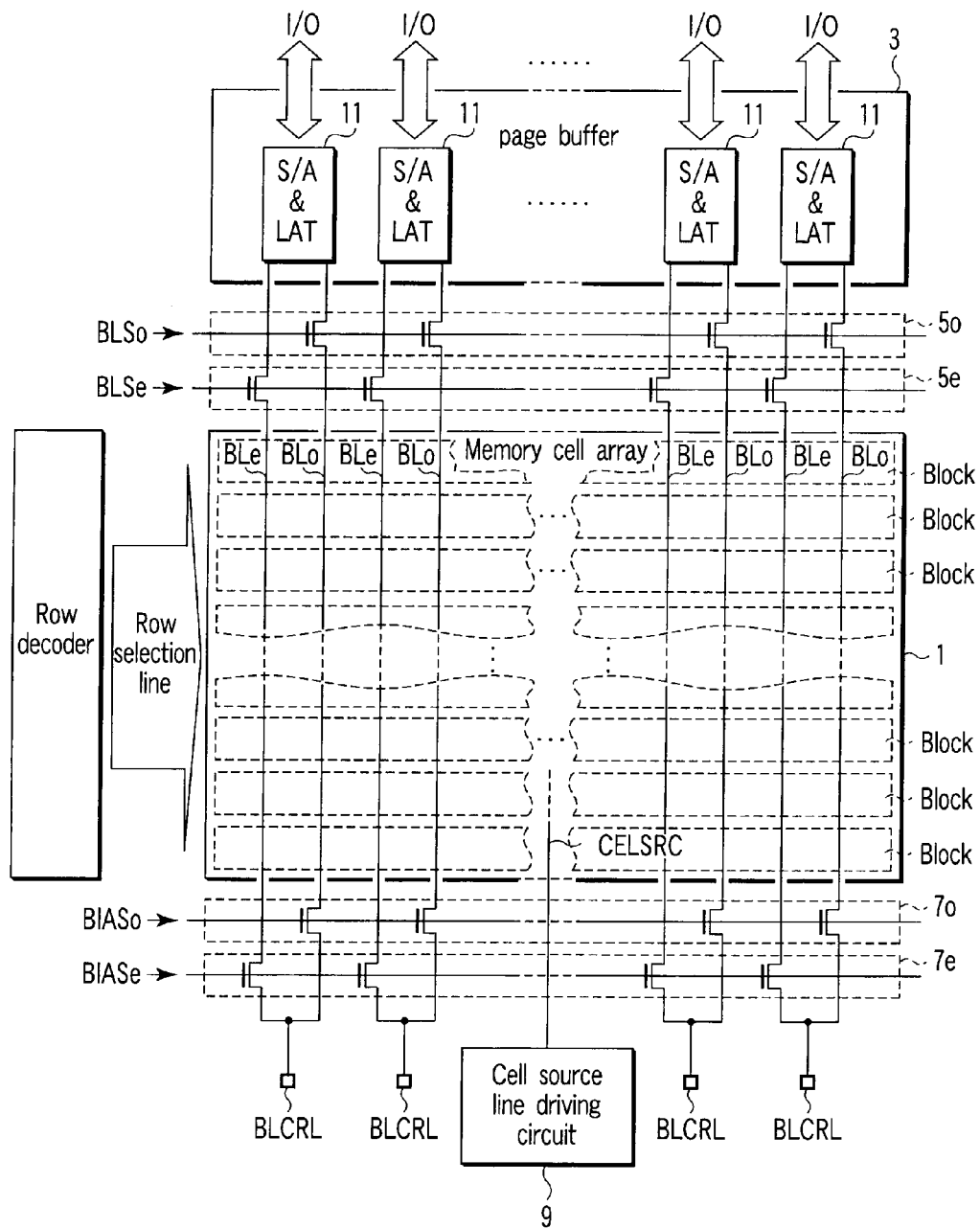
FIG. 1 is a block diagram showing one example of the configuration of a memory cell array of a semiconductor integrated circuit device according to a first embodiment of this invention and a peripheral circuit thereof.

FIG. 1 is a block diagram showing one example of the configuration of a memory cell array of a semiconductor integrated circuit device according to a first embodiment of this invention and a peripheral circuit thereof.

As shown in FIG. 1, the semiconductor integrated circuit device according to the first embodiment includes a memory cell array 1, page buffer 3, even-numbered/odd-numbered bit line selection switching circuits 5e/5o, even-numbered/odd-numbered bit line bias switching circuits 7e/7o, and source line driving circuit 9.

Even-numbered bit lines BLe and odd-numbered bit lines BLo are arranged in the memory cell array 1. One-side ends of the even-numbered bit lines BLe are electrically connected to the page buffer 3 via the even-numbered bit line selection switching circuit 5e and the other ends thereof are electrically connected to bit line bias potential terminals BLCRL via the even-numbered bit line bias switching circuit 7e. Likewise, one-side ends of the odd-numbered bit lines BLo are electrically connected to the page buffer 3 via the odd-numbered bit line selection switching circuit 5o and the other ends thereof are electrically connected to the bit line bias potential terminals BLCRL via the odd-numbered bit line bias switching circuit 7o.

Further, for example, if rewritable nonvolatile semiconductor memory elements are integrated in the memory cell array 1, the memory cell array 1 has a plurality of blocks, a block being a minimum unit of data erase. For example, in the case of a NAND type flash memory, one block is defined by a portion sandwiched by a bit line-side selection transistor and a source line-side selection transistor.

In the page buffer 3, for example, circuits 11 each including a sense amplifier and data register are provided.

The sense amplifier identifies a potential level or current level of cell data read out from the memory cell array 1 via the even-numbered bit line BLe or odd-numbered bit line BLo and amplifies the cell data.

For example, the data register is used as follows when rewritable nonvolatile semiconductor memory elements are integrated in the memory cell array 1.

The data register holds program data supplied from the exterior of the memory cell array 1 and programmed into the memory cell array 1 or holds cell data read from the memory cell array 1. Program data held by the data register is supplied to a memory cell selected via the even-numbered bit line BLe or odd-numbered bit line BLo at the programming operation time. The cell data is output to the exterior of the memory cell array 1 as read data at the read operation time. Further, at the verify read operation time, whether data is programmed according to program data or not is verified. The data register can also be used as a sense amplifier as is well known in the art.

FIG. 2 shows one example of a circuit of one column containing a data register and sense amplifier of one column of the page buffer 3. The circuit of the example is used when the rewritable nonvolatile semiconductor memory elements are integrated in the memory cell array 1. The page buffer 3 is not limited to the circuit of FIG. 2 and a known circuit can be used. Therefore, in the following explanation, only important points are simply explained.

As shown in FIG. 2, the circuit 11 includes a primary data cache (PDC), secondary data cache (SDC), dynamic data cache (DDC) and temporary data cache (TDC). SDC, PDC, DDC hold program data at the program operation time, hold cell data at the read operation time and temporarily hold cell data at the verify operation time. For example, TDC temporarily holds cell data amplified by SDC or PDC.

Further, the circuit 11 can be utilized in both of a binary memory and multi-value memory. When it is used in the multi-value memory, SDC, PDC, DDC and TDC are used for the data holding operation as described above and used for an internal data holding operation. That is, since SDC, PDC, DDC and TDC can independently hold data, it can be used for the internal data holding operation.

Figure 6:
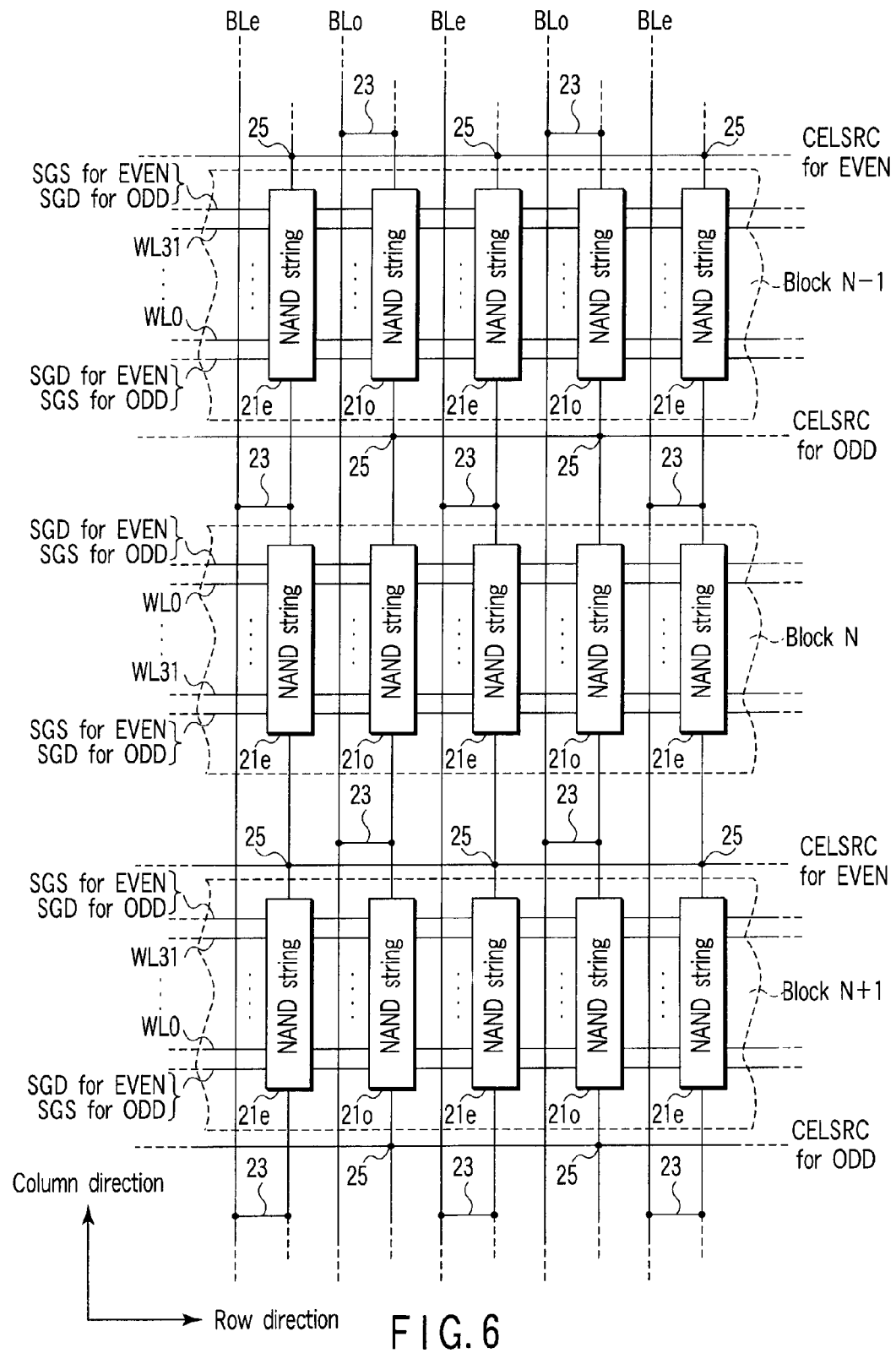
FIG. 6 is a circuit diagram (plural blocks) showing a circuit example of a memory cell array of the semiconductor integrated circuit device according to the second embodiment.

A page buffer having the same circuit as the circuit 11 is described in FIG. 6 or the like of Patent Application No. 2004-24475 (filed on 2004, Jan. 1) which is a prior application of the applicant of this case and in FIG. 6 or the like of Patent Application No. 2004-160165 (filed on 2004, May 28, corresponding U.S. patent application Ser. No. 10/988,592, filed on 2004, Nov. 16) which is a patent application based on the priority of the above application.

The page buffer and various types of page buffers may be used as well, including the U.S. patent application Ser. No. 10/988,592, the entire contents of this reference being incorporated herein by reference.

For example, the even-numbered/odd-numbered bit line selection switching circuits 5e/5o electrically connect the even-numbered bit lines BLe to the page buffer 3 according to the even-numbered bit line selection signal BLSe when the even-numbered bit lines are selected at the program operation time or read operation time. At this time, the odd-numbered bit lines BLo are electrically disconnected from the page buffer 3 according to the odd-numbered bit line selection signal BLSo.

On the other hand, if the odd-numbered bit lines are selected, the even-numbered/odd-numbered bit line selection switching circuits 5e/5o electrically connect the odd-numbered bit lines BLo to the page buffer 3 according to the odd-numbered bit line selection signal BLSo. At this time, the even-numbered bit lines BLe are electrically disconnected from the page buffer 3 according to the even-numbered bit line selection signal BLSe.

The even-numbered/odd-numbered bit line bias switching circuits 7e/7o connect the even-numbered bit lines BLe and odd-numbered bit lines BLo to the bit line bias potential terminal BLCRL according to the even-numbered bit line selection signal BLSe and odd-numbered bit line selection signal BLSo. Bit line bias potentials are applied to the even-numbered bit lines BLe and odd-numbered bit lines BLo.

The even-numbered/odd-numbered bit line bias switching circuits 7e/7o of this example set a state in which both of the even-numbered bit lines BLe and odd-numbered bit lines BLo are disconnected from the bit line bias potential terminal BLCRL at the program operation time. As a result, if the even-numbered bit lines BLe are selected, the even-numbered/odd-numbered bit line bias switching circuits 7e/7o set the odd-numbered bit lines BLo into an electrically floating state.

On the other hand, if the odd-numbered bit lines BLo are selected, the even-numbered/odd-numbered bit line bias switching circuits 7e/7o set the even-numbered bit lines BLe into an electrically floating state.

Thus, in the semiconductor integrated circuit device of the present embodiment, if the even-numbered bit lines BLe are selected at the program operation time, the unselected odd-numbered bit lines BLo are set into an electrically floating state, and if the odd-numbered bit lines BLo are selected, the unselect (or unselected) even-numbered bit lines BLe are set into an electrically floating state.

When rewritable nonvolatile semiconductor memory elements are integrated in the memory cell array 1, for example, it is necessary to transmit a programming suppression potential which suppresses programming to unselect memory elements in the case of NAND type. In this example, the programming suppression potential is transmitted to the unselect memory elements via a cell source line CELSRC. For this purpose, in this example, a cell source line driving circuit 9 is provided.

The cell source line driving circuit 9 drives the cell source line CELSRC by changing the potential at the program operation time and read operation time. For example, the cell source line driving circuit 9 drives the cell source line CELSRC by use of the programming suppression potential which suppresses programming at the program operation time and drives the cell source line CELSRC by use of the source potential in the read operation at the read operation time. One example of the programming suppression potential is potential VDD and one example of the source potential is potential VSS. The potential VDD is the in-circuit power supply potential and may be set equal to the internal power supply potential used in the logic circuit except a boosted voltage-series circuit, for example. The potential VSS is the in-circuit ground potential and may be set to 0V (ground), for example.

In the semiconductor integrated circuit device according to the first embodiment of this invention, a bit line adjacent to the selected bit line is set into the electrically floating state at the program operation time. As one example, when the even-numbered bit lines are selected, the odd-numbered bit lines are set into the electrically floating state and when the odd-numbered bit lines are selected, the even-numbered bit lines are set into the electrically floating state. As a result, at the program operation time, the bit line adjacent to the selected bit line does not function as the electrode of a capacitor in the circuit operation.

That is, one bit line which is set into the electrically floating state is inserted between the selected bit lines. In this case, two or more bit lines can be inserted depending on the circuit. Thus, the selected bit lines functioning as the electrodes of the capacitors can be separated away from each other.

As a result, even if the arrangement pitch of the bit lines becomes smaller with increasing miniaturization, a rapid increase in the bit line capacitance C can be suppressed. Alternatively, the bit line capacitance C can be lowered.

Figure 3:
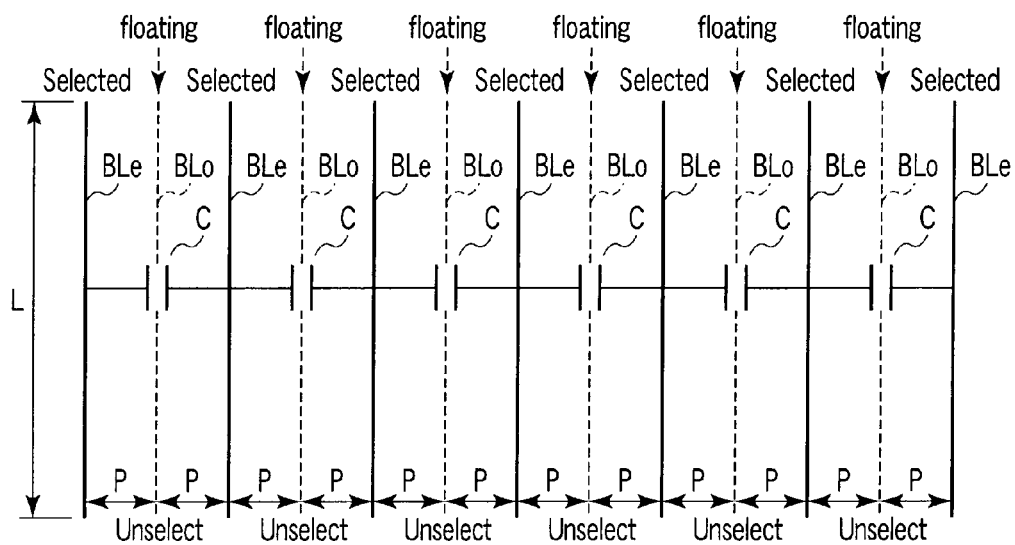
FIG. 3 is a plan view for illustrating the operation of the semiconductor integrated circuit device according to the first embodiment.

For example, as shown in the simplified plan view of FIG. 3, in the first embodiment, a bit line applied with the potential at the program operation time is a selected bit line. When the length of the bit line is L and the arrangement pitch of the bit lines is P, one unselect bit line which is set into the electrically floating state is inserted between the selected bit lines, and therefore, the distance between the bit lines applied with the potentials is P×2.

Figure 4:
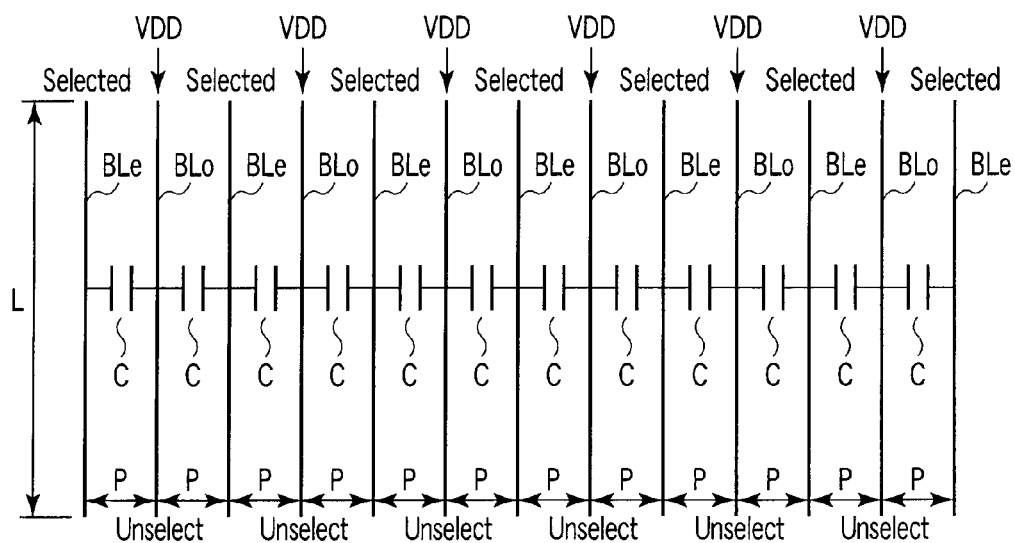
FIG. 4 is a plan view for illustrating the operation of a comparison example.

On the other hand, as shown in FIG. 4, when the programming suppression potential (VDD) is applied to the unselect bit line (comparison example), the distance between the bit lines applied with the potentials is P.

Thus, in the first embodiment, even when the bit line length L becomes larger or the arrangement pitch P of the bit lines is reduced, a rapid increase in the bit line capacitance C can be suppressed in the circuit operation.

Therefore, in the semiconductor integrated circuit device according to the first embodiment, a semiconductor integrated circuit device which is difficult to have a bad influence on enhancement of the operation speed and a data programming method thereof can be attained.

Second Embodiment

A second embodiment relates to one example of a new circuit of a memory cell array which can be used in the semiconductor integrated circuit device according to the first embodiment and the data programming method thereof. The circuit of this example can be used in an NAND type non-volatile semiconductor memory, for example.

Figure 5:
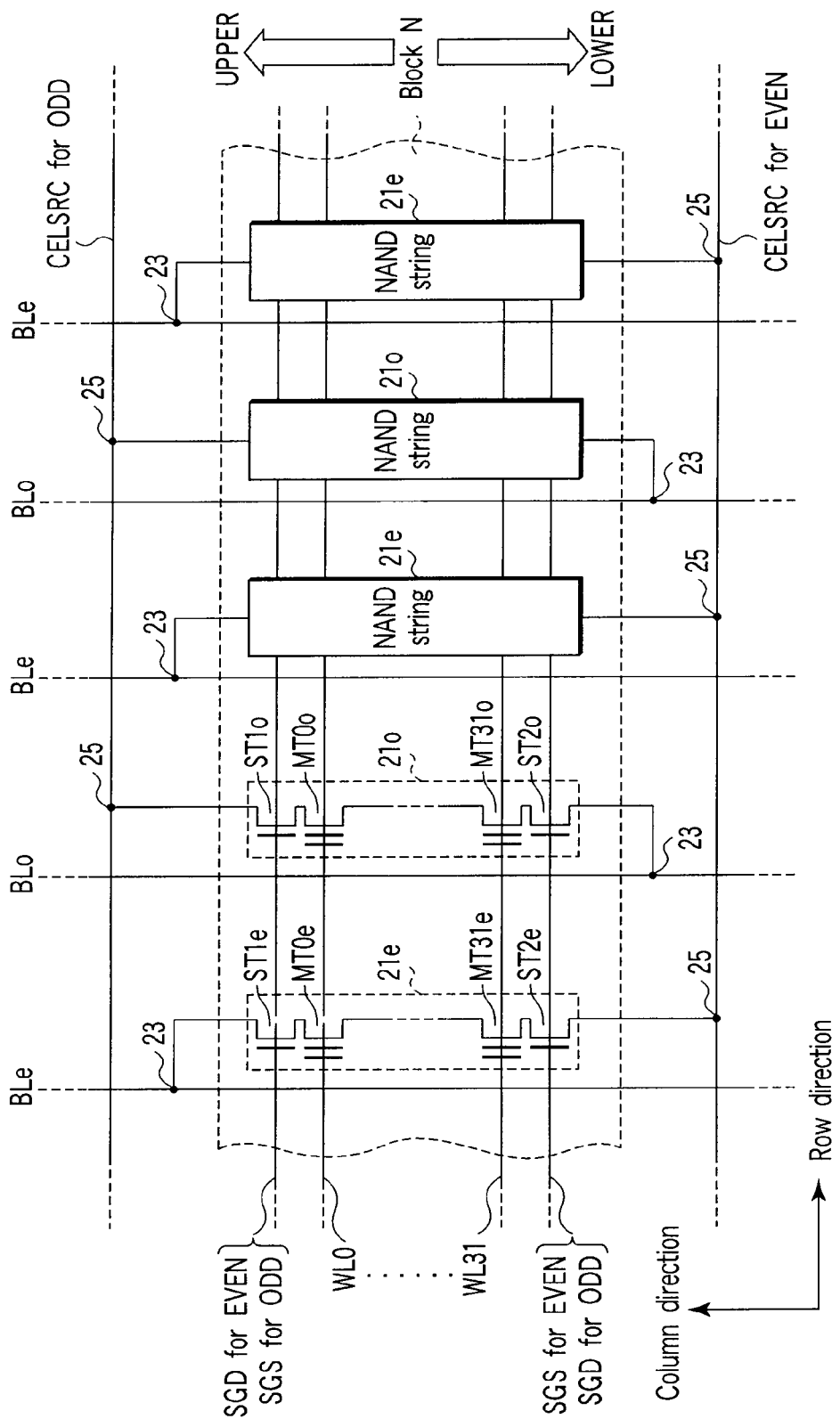
FIG. 5 is a circuit diagram (one block) showing a circuit example of a memory cell array of a semiconductor integrated circuit device according to a second embodiment of this invention.

FIGS. 5 and 6 are circuit diagrams showing circuit examples of a memory cell array of the semiconductor integrated circuit device according to the second embodiment of this invention. FIG. 5 shows only one block N and FIG. 6 shows a block N and blocks (N−1) and (N+1) which are adjacent to the block N.

As shown in FIGS. 5 and 6, first memory elements are electrically connected between the even-numbered bit lines BLe and the cell source lines CELSCR and second memory elements are electrically connected between the odd-numbered bit lines BLo and the cell source lines CELSCR. In this example, the first memory element is a first NAND string 21e and the second memory element is a second NAND string 21o.

The first NAND string 21e includes a first bit line-side selection transistor ST1e, first cell source line-side selection transistor ST2e and first memory cell transistors MTe (in this example, MT0e to MT31e). The memory cell transistors MTe (MT0e to MT31e) are serially connected between one end of the current path of the selection transistor ST1e and one end of the current path of the selection transistor ST2e.

Likewise, the second NAND string 21o includes a second bit line-side selection transistor ST1o, second cell source line-side selection transistor ST2o and second memory cell transistors MTo (in this example, MT0o to MT31o). The memory cell transistors MTo (MT0o to MT31o) are serially connected between one end of the current path of the selection transistor ST1o and one end of the current path of the selection transistor ST2o.

The gates of the selection transistors ST1e and the gates of the selection transistors ST1o are connected to a first selection gate line SGD for EVEN/SGS for ODD. Thus, the selection transistors ST1e, ST1o are driven by use of a first selection gate signal which is commonly used.

Likewise, the gates of the selection transistors ST2e and the gates of the selection transistors ST2o are connected to a second selection gate line SGS for EVEN/SGD for ODD. Thus, the selection transistors ST2e, ST2o are driven by use of a second selection gate signal which is commonly used.

The gates of the first memory cell transistors Mte (MT0e to MT31e) and the gates of the second memory cell transistors MTo (MT0o to MT31o) are respectively connected to the word lines WL (WL0 to WL31). Thus, the memory cell transistors MTe, MTo are driven by a common row selection signal.

The selection gate lines SGD for EVEN/SGS for ODD and SGS for EVEN/SGD for ODD and word lines WL correspond to the row selection lines shown in FIG. 1.

In this example, the cell source lines CELSRC include even-numbered cell source lines CELSRC for EVEN and odd-numbered cell source lines CELSRC for ODD.

Therefore, the selection transistors ST1e can be arranged on the same row as the selection transistors ST1o and the selection transistors ST2e can be arranged on the same row as the selection transistors ST2o.

For example, in FIG. 5, contacts 23 between the first NAND strings 21e and the even-numbered bit lines BLe are arranged on the upper side (UPPER) and contacts 25 between the first NAND strings 21e and the even-numbered cell source line CELSRC for EVEN are arranged on the lower side (LOWER) with the NAND strings 21e and 21o set at the center. The arrangement of the contacts 23, 25 of the second NAND strings 21o is set opposite to that of the first NAND strings 21e. Therefore, the gates of the selection transistors ST1e and the gates of the selection transistors ST1o can be linearly formed. Likewise, the gates of the selection transistors ST2e and the gates of the selection transistors ST2o can be linearly formed. As a result, they can be arranged on the same rows.

The first memory cell transistors MTe are arranged on the same row as the second memory transistors MTo.

For example, the even-numbered cell source lines CELSRC for EVEN and the odd-numbered cell source lines CELSRC for ODD are formed along the row selection lines (SGD for EVEN/SGS for ODD, SGS for EVEN/SGD for ODD and WL) in the row direction and may be arranged to intersect, for example, cross at right angles the even-numbered bit lines BLe and odd-numbered bit lines BLo formed in the column direction.

FIG. 5 shows only one block N. If a plurality of blocks are provided in the memory cell array 1, the block shown in FIG. 5 may be repeatedly formed in the column direction while the contacts 23, 25 are commonly used by the adjacent blocks (N−1) and (N+1) as shown in FIG. 6. As a result, blocks which are the same as the block shown in FIG. 5 can be theoretically limitlessly formed in the memory cell array 1.

Next, one example of the operation of the above circuit is explained. Since the known operations can be used as the read operation and erase operation among the above operation, only the program operation is explained in the following explanation.

[Program Operation]

FIG. 7 is a waveform diagram showing one operation example of the semiconductor integrated circuit device according to the second embodiment.

The program operation corresponds to the operation performed in a case where the circuit shown in FIG. 2 is connected to the circuits shown in FIGS. 5, 6. In the following explanation, the operation with time is explained while taking a case wherein an even-numbered bit line BLe is selected as an example and paying attention to a selected block.

In unselect blocks, the potential of the first selection gate lines SGD for EVEN/SGS for ODD and the potential of the second gate lines SGS for EVEN/SGD for ODD are set at 0V, for example. Therefore, the selection transistors ST1e, ST1o, ST2e, ST2o are turned off.

[1. time t1]

For example, the potential of the first selection gate lines SGD for EVEN/SGS for ODD is raised from 0V to potential Vsg. As a result, the selection transistors ST1e, ST1o are turned on.

For example, the potential of the second gate lines SGS for EVEN/SGD for ODD is maintained at 0V. Therefore, the selection transistors ST2e, ST2o are kept off.

The potential of the selected word line WL and the potential of the unselect word line WL are maintained at 0V, for example.

For example, the potential of the cell source line CELSRC is raised from 0V to VDD, for example, 2.5 to 3V. However, in this example, it is assumed that the even-numbered cell source line CELSRC for EVEN and odd-numbered cell source line CELSRC for ODD are driven together by the cell source line CELSRC.

For example, the potential of the even-numbered bit line BLe and the potential of the odd-numbered bit line BLo are maintained at 0V.

The potential of the bit line bias potential terminal BLCRL is raised from 0V to the potential VDD.

The bit line bias signals BIASe, BIASo are temporarily set at 0V. Therefore, the selection switch circuits 7e, 7o are turned off.

The bit line selection signals BLSe, BLSo are maintained at 0V. Therefore, the selection switch circuits 5e, 5o are kept off.

The potential of a data cache control signal BLC1 and the potential of a bit line clamp signal BLCLAMP are raised from 0V to the potential Vsg and then further raised to higher potential, for example, 4.5V. Program data held in PDC in the page buffer 3 is transferred to TDC.

[2. time t2]

After time t1, the potential of the bias signal BIASo is temporarily raised from 0V to a potential of approximately 3V and then set back to 0V again. The bias switch circuit 7o is temporarily turned on and then turned off again.

When the bias switch circuit 7o is temporarily turned on, the unselect bit line BLo is charged from the bias potential terminal BLCRL to a voltage of 1V to 1.5V and is then set into an electrically floating state.

The potential of the selection signal BLSe is temporarily raised from 0V to a potential of (threshold voltage Vt of selection switch circuit 5e+approximately 3V) (the potential which permits data 0 on the page buffer 3 side to pass through and prevents data 1 from passing through is suitable) and is then raised to a potential of 7.5V. In this case, the selection switch circuit 5e is turned on.

Program data 0 or 1 held in TDC is transferred to the selected even-numbered bit line BLe with the unselect bit lines BLo set in the electrically floating state.

When program data is 0, the potential of the even-numbered bit line BLe is set to the potential VSS, for example, 0V.

On the other hand, when program data is 1, the potential of the even-numbered bit line BLe is set to the potential VDD, for example, 2.5 to 3V.

In FIG. 7, broken lines on the lower side which indicate the floating state of the odd-numbered bit line BLo indicate a case wherein data on the adjacent selected even-numbered bit line BLe is data 0 and broken lines on the upper side indicate a case of data 1 (the potential of the unselected odd-numbered bit line BLo is raised by the capacitive coupling).

The potential of the even-numbered bit line BLe is transferred to a channel portion (for example, which extends to the drain of the memory cell transistor MTe shown in FIG. 5) of the NAND string 21e in the selected block via the selection transistor ST1e.

Further, the potential VDD, for example, a potential of 2.5 to 3V is transferred from the cell source line CELSRC to a channel portion (for example, which extends to the drain of the memory cell transistor MTo shown in FIG. 5) of the NAND string 21o in the selected block via the selection transistor ST1o. The potential of 2.5 to 3V is potential used to suppress programming.

[3. time t3]

After time t2, the potential of the first selection gate line SGD for EVEN/SGS for ODD is temporarily set back from the potential Vsg to 0V.

In this case, the selection transistors ST1e, ST1o are turned off.

The channel portion of the NAND string 21e in the selected block is set into the electrically floating state with data 0 or 1 transferred thereto.

Likewise, the channel portion of the NAND string 21o in the selected block is set into the electrically floating state with the potential of 1 to 1.5V transferred thereto.

[4. time t4]

After time t3, the potential of the first selection gate line SGD for EVEN/SGS for ODD is raised from 0V to potential Vsgd. The potential Vsgd is potential which permits data 0 to pass through and prevents data 1 from passing through.

In the case of program data 0, the selection transistor ST1e is turned on. Therefore, for example, the channel portion of the NAND string 21e is electrically connected to the even-numbered bit line BLe and the potential thereof is set to the potential VSS, for example, 0V.

On the other hand, when program data is 1, the selection transistor ST1e is kept off. Therefore, data 1 is maintained with the potential of the channel portion of the NAND string 21e kept in the electrically floating state.

In this case, the selection transistor ST1o is kept off. Therefore, the potential of 2.5 to 3V is maintained with the potential of the channel portion of the NAND string 21o kept in the electrically floating state.

[5. time t5]

After time t4, the potential of the unselect word line WL (WLunselect) is raised from 0V to potential Vpass, for example. The potential Vpass is potential which turns on the memory cell transistor MT even when the threshold voltage thereof is high.

The unselect memory cell transistors MT in the NAND strings 21e, 21o in the selected block are turned on.

Further, the potential of the selected word line WL (WLselect) is raised from 0V to potential Vpgm', for example. The potential Vpgm' is potential which turns on the memory cell transistor MT only when the threshold voltage thereof is low.

The selected memory cell transistors MT in the NAND strings 21e, 21o in the selected block are turned off when the threshold voltage thereof is high. When the threshold voltage is low, the transistors are turned on.

[6. time t6]

After time t5, the potential of the selected word line WL (WLselect) is raised from the potential Vpgm' to the potential Vpgm.

In the case of program data 0, the channel of the NAND string 21e is set at the potential VSS, for example, 0V. Therefore, the potential difference between the control gate and the channel of the selected memory cell transistor MT in the NAND string 21e is enlarged. As a result, electrons are injected from the channel into the floating gate of the memory cell transistor MT to shift the threshold voltage of the memory cell transistor MT to a higher state.

On the other hand, in the case of program data 1, the channel of the NAND string 21e is set into the electrically floating state. Therefore, the potential of the channel of the selected memory cell transistor MT in the NAND string 21e is raised by the capacitive coupling. Thus, enlargement of the potential difference between the control gate and the channel of the selected memory cell transistor MT in the NAND string 21e is suppressed. As a result, injection of electrons into the floating gate is suppressed and the threshold voltage of the memory cell transistor MT is suppressed from being shifted to a higher state.

The channel of the NAND string 21o is set in the electrically floating state. Therefore, like the case wherein data to be programmed is 1, the threshold voltage of the memory cell transistor MT is suppressed from being shifted to a higher state.

[7. time t7]

After this, the recovery operation is performed.

First, the potential of the clamp signal BLCLAMP and the potential of the control signal BLC1 are returned from 4.5 to 0V, for example. The page buffer 3 is electrically disconnected from the memory cell array 1 and PDC is electrically disconnected from TDC.

[8. time t8]

After time t7, the potential of the word line WL (unselect) is returned from the potential Vpgm to 0V, for example.

[9. time t9]

After time t8, the potential of the word line WL (unselect) is returned from the potential Vpass to 0V, for example.

[10. time t10]

After time t9, the potential of the selection gate line SGD for EVEN/SGS for ODD is returned from the potential Vsgd to 0V, for example.

Further, the potential of the cell source line CELSRC is returned from the potential VDD to 0V, for example.

[11. time t11]

After time t10, the potential of the selection signal BLSe is returned from 7.5 to 0V, for example. Therefore, the selection switch circuit 5e is off.

The potentials of the bias signals BIASe, BIASo are set from 0 to 7.5V. In this case, the switch circuits 7e, 7o are turned on.

As the result, the even-numbered bit lines BLe and odd-numbered bit lines BLo are biased to the potential of the bias potential terminal BLCRL.

[12. time t12]

After time t11, the potential of the bias potential terminal BLCRL is returned from VDD to 0V, for example.

As a result, the potentials of the even-numbered bit lines BLe and odd-numbered bit lines BLo are returned to 0V, for example.

[13. time t13]

After time t12, the potentials of the bias signals BIASe, BIASo are returned from 7.5 to 0V. Thus, the switch circuits 7e, 7o are turned off.

The programming operation is completed by the above operations.

Figure 8:
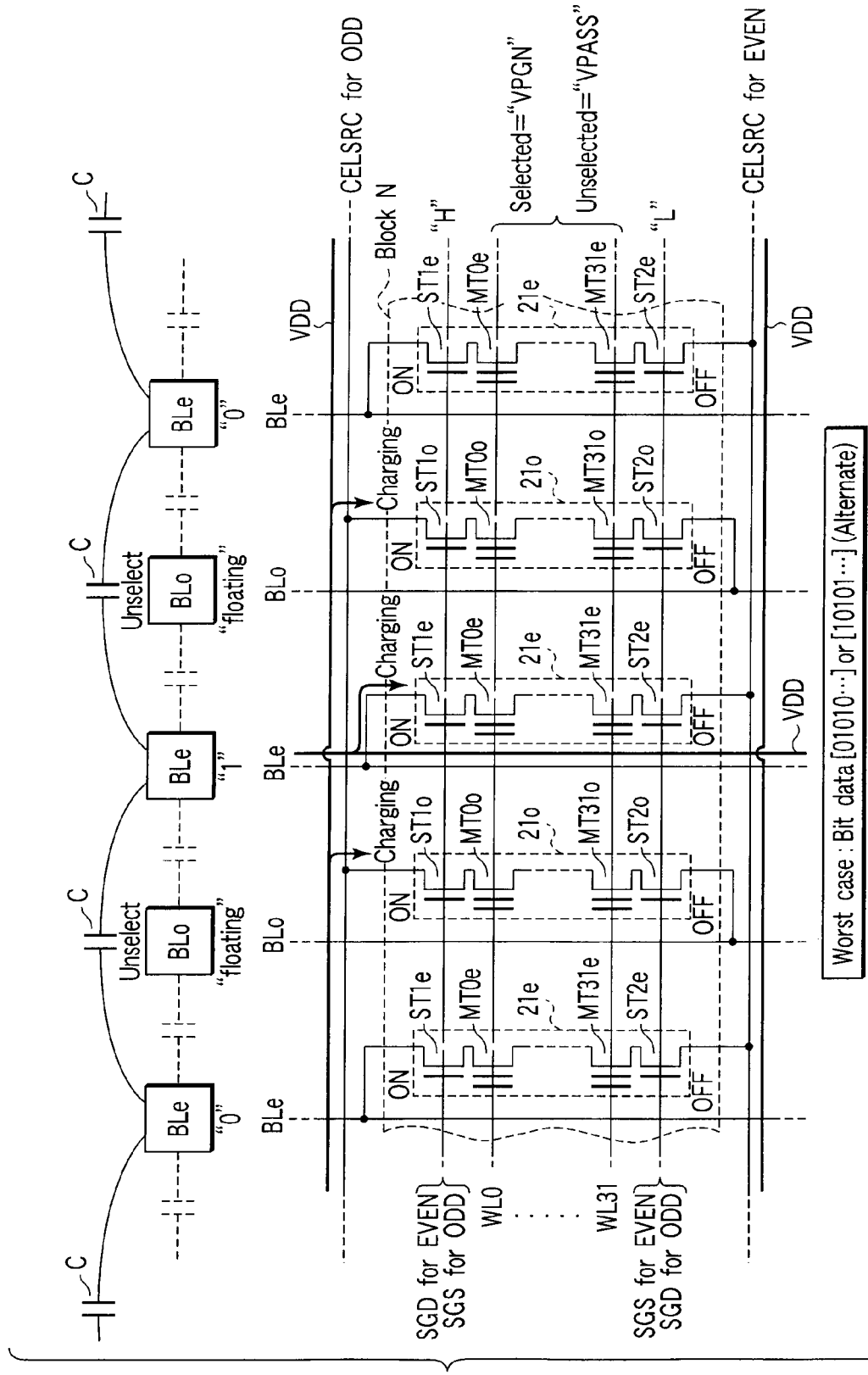
FIG. 8 is a diagram (BLe selected) showing a state of data transfer in the semiconductor integrated circuit device according to the second embodiment.

A state in which data is transferred from the selected bit line in the above operation is shown in FIG. 8. FIG. 8 shows a state in which the even-numbered bit line BLe is selected.

As shown in FIG. 8, program data 0 or 1 is supplied to the NAND string 21e via the selected odd-numbered bit line BLe and selection transistor ST1e. In this case, the unselect odd-numbered bit lines BLo are set into the electrically floating state. Potential which suppresses programming (in this example, VDD) is applied to the NAND string 21o via the odd-numbered cell source line CELSRC for ODD and selection transistor ST1o.

FIG. 9 shows a comparison example. The comparison example shown in FIG. 9 is an example in which the potential which suppresses programming (in this example, VDD) is applied to the NAND string 21o via the unselect odd-numbered bit line BLo and selection transistor ST1.

In the second embodiment, the bit line capacitance C can be reduced in the circuit operation in comparison with the comparison example shown in FIG. 9.

Figure 10:
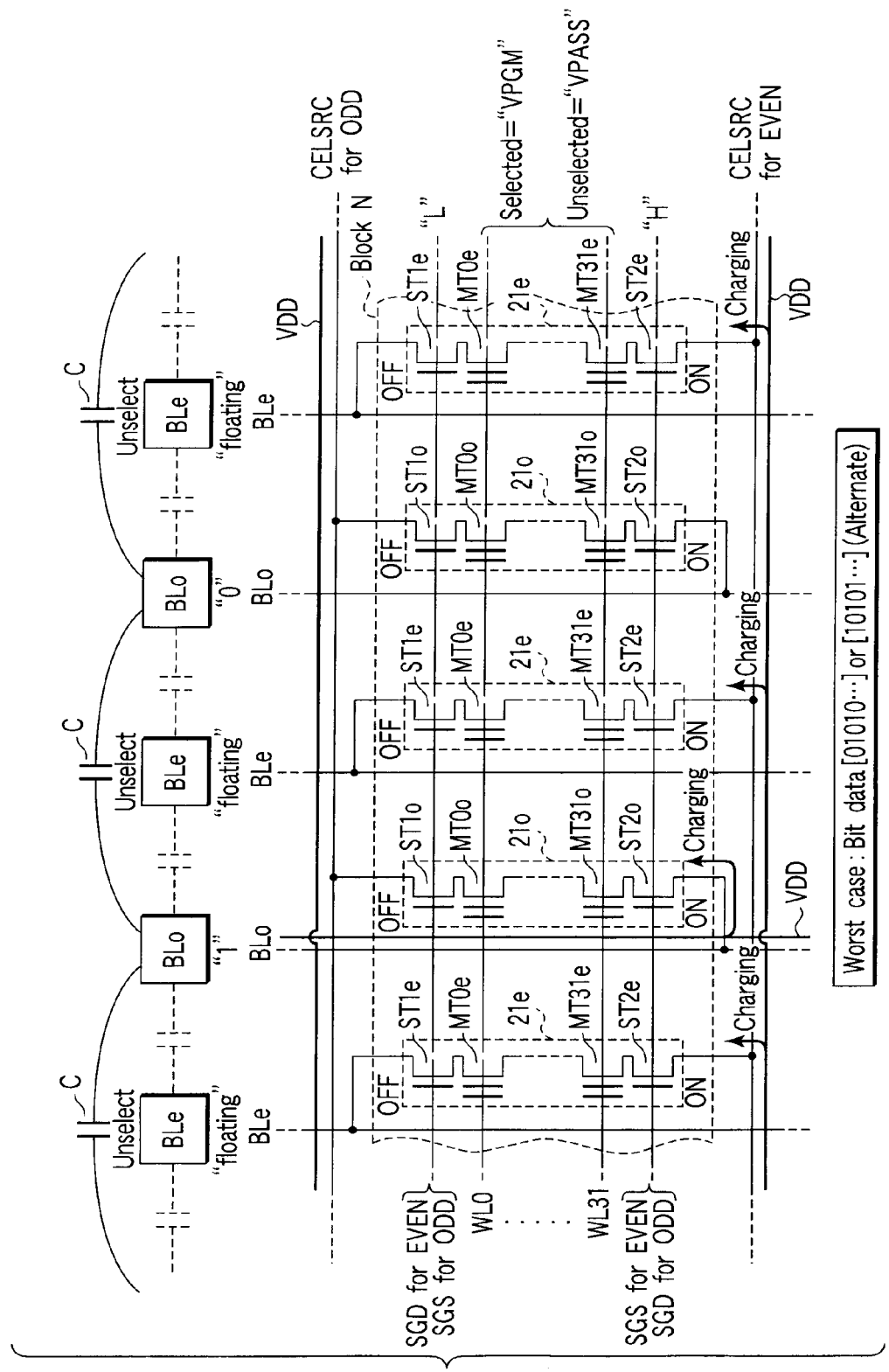
FIG. 10 is a diagram (BLo selected) showing a state of data transfer in the semiconductor integrated circuit device according to the second embodiment.
Figure 11:
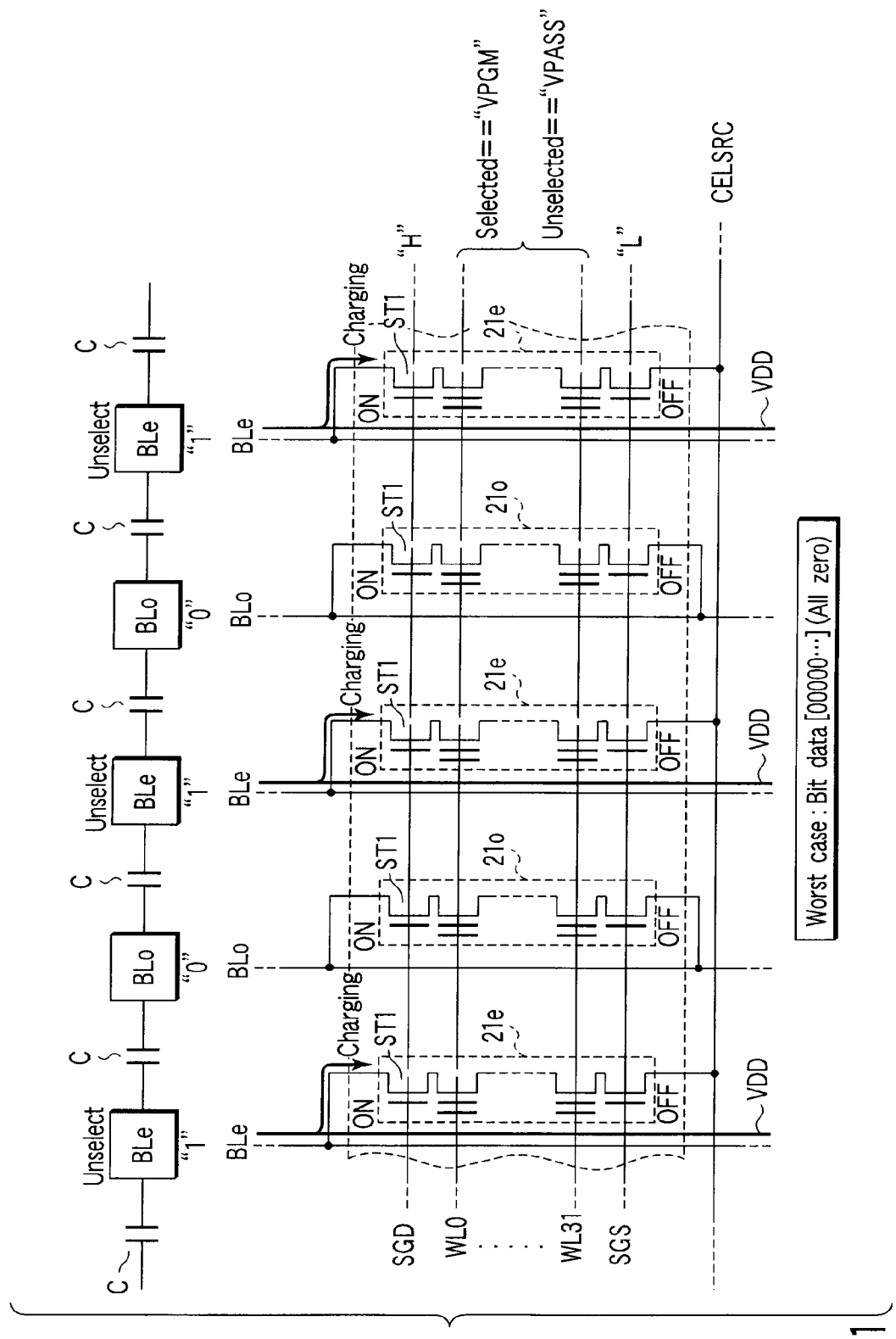
FIG. 11 is a diagram (BLo selected) showing a comparison example.

A case wherein the odd-numbered bit line BLo is selected is shown in FIG. 10 and the comparison example is shown in FIG. 11. FIGS. 10 and 11 are similar to FIGS. 8 and 9 except that the selected bit lines are different. Therefore, the explanation thereof is omitted.

According to the second embodiment, a new circuit of the memory cell array which can be used for the semiconductor integrated circuit device and the data programming method thereof according to the first embodiment can be attained.

Third Embodiment

A third embodiment relates to one example of a device which realizes a circuit according to one example shown in the second embodiment.

Figure 12:
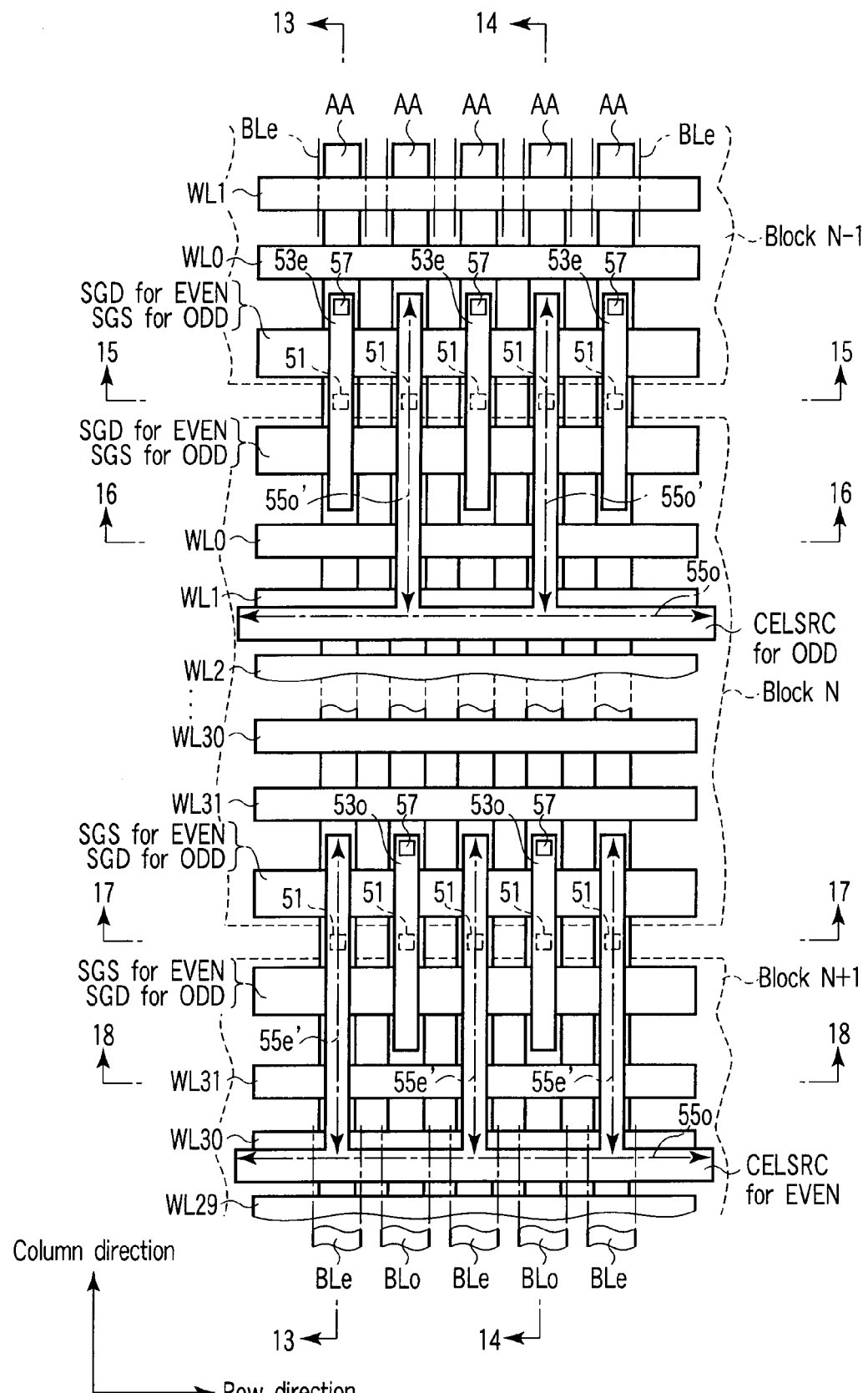
FIG. 12 is a plan view showing one example of a plane pattern of a semiconductor integrated circuit device according to a third embodiment of this invention.
Figure 13:
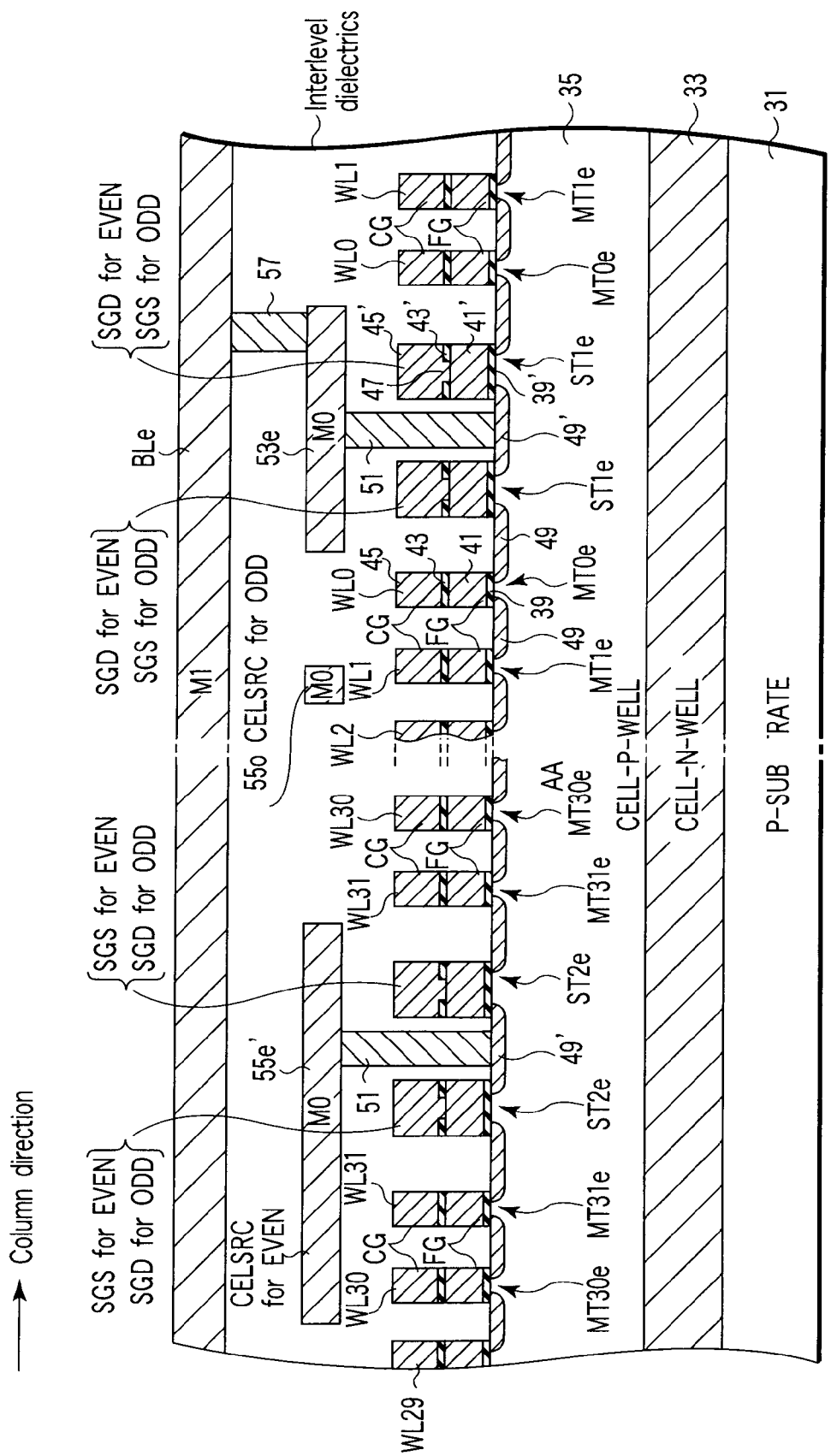
FIG. 13 is a cross-sectional view taken along the 13-13 line of FIG. 12.
Figure 14:
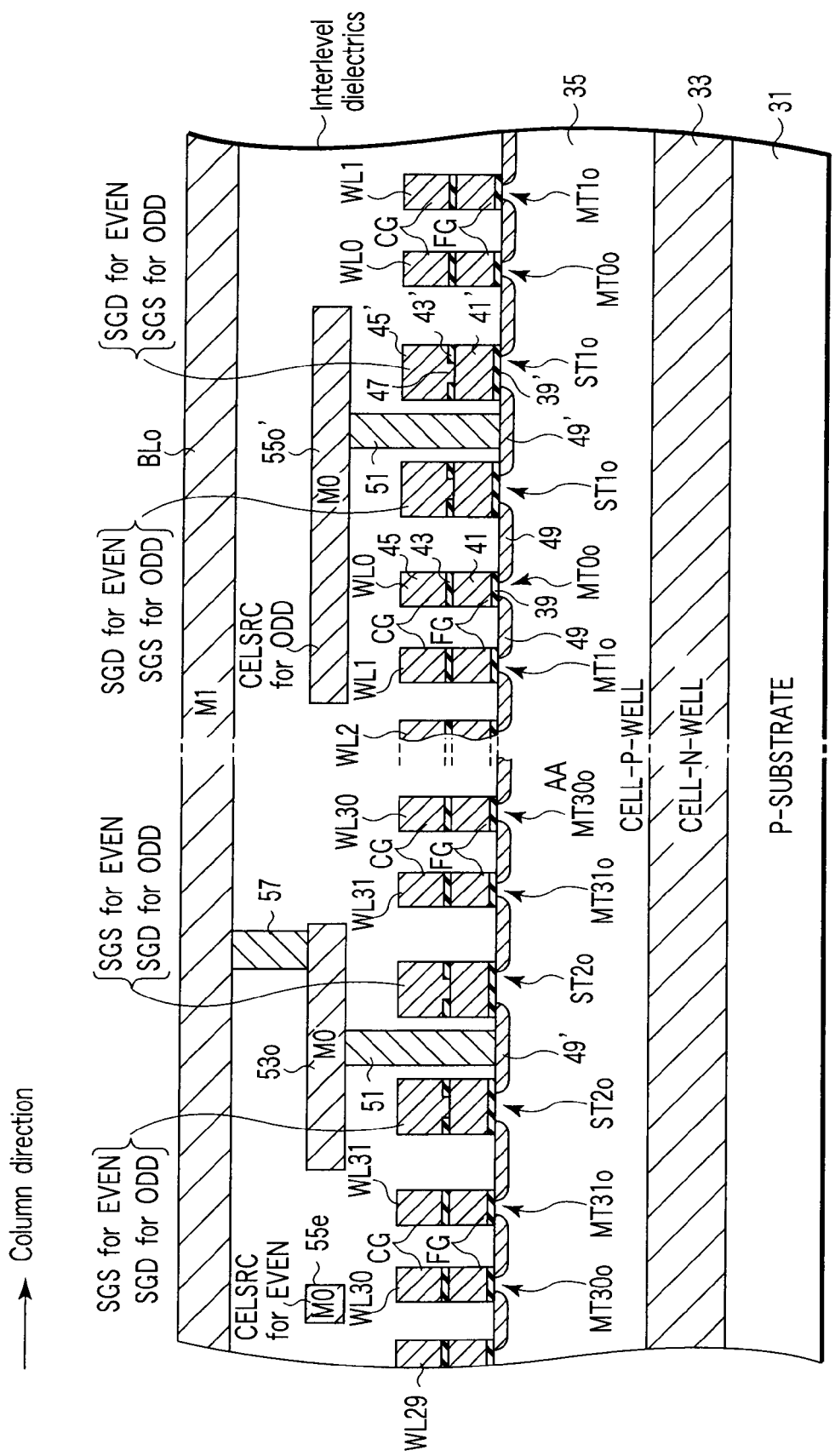
FIG. 14 is a cross-sectional view taken along the 14-14 line of FIG. 12.
Figure 15:
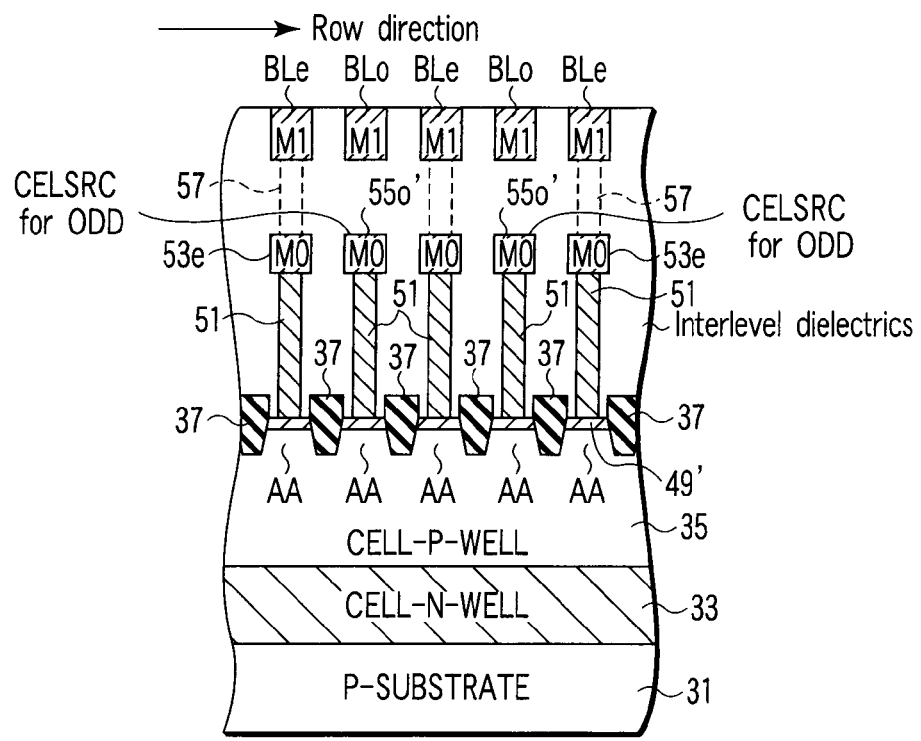
FIG. 15 is a cross-sectional view taken along the 15-15 line of FIG. 12.
Figure 16:
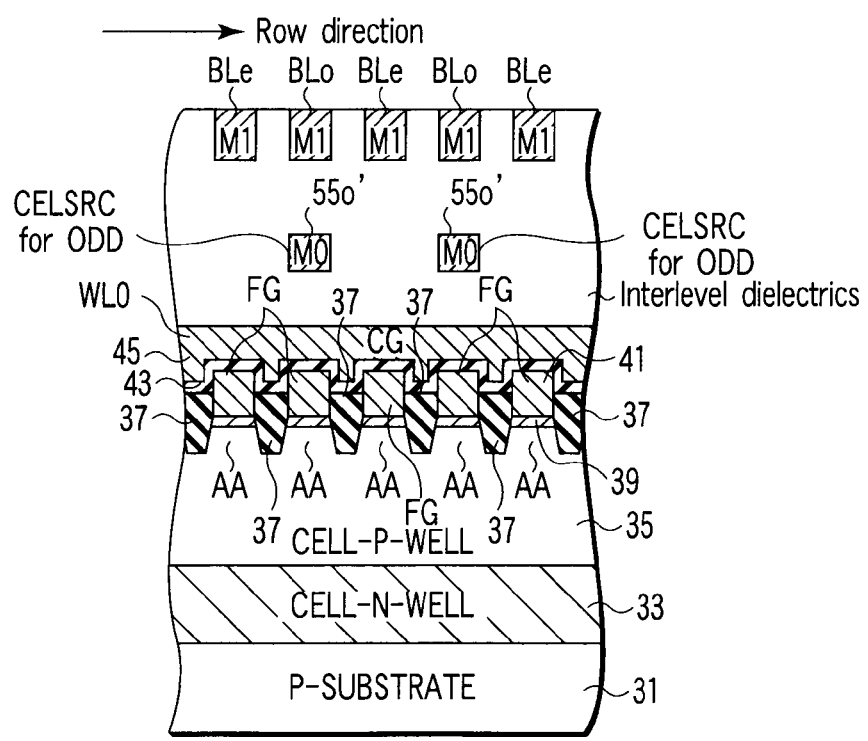
FIG. 16 is a cross-sectional view taken along the 16-16 line of FIG. 12.
Figure 17:
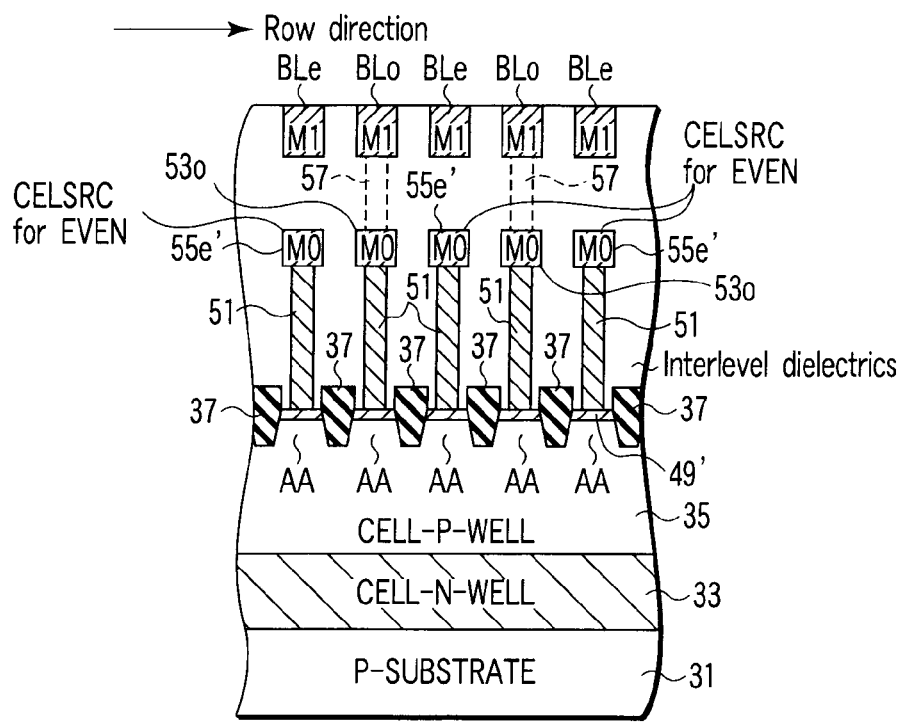
FIG. 17 is a cross-sectional view taken along the 17-17 line of FIG. 12.
Figure 18:
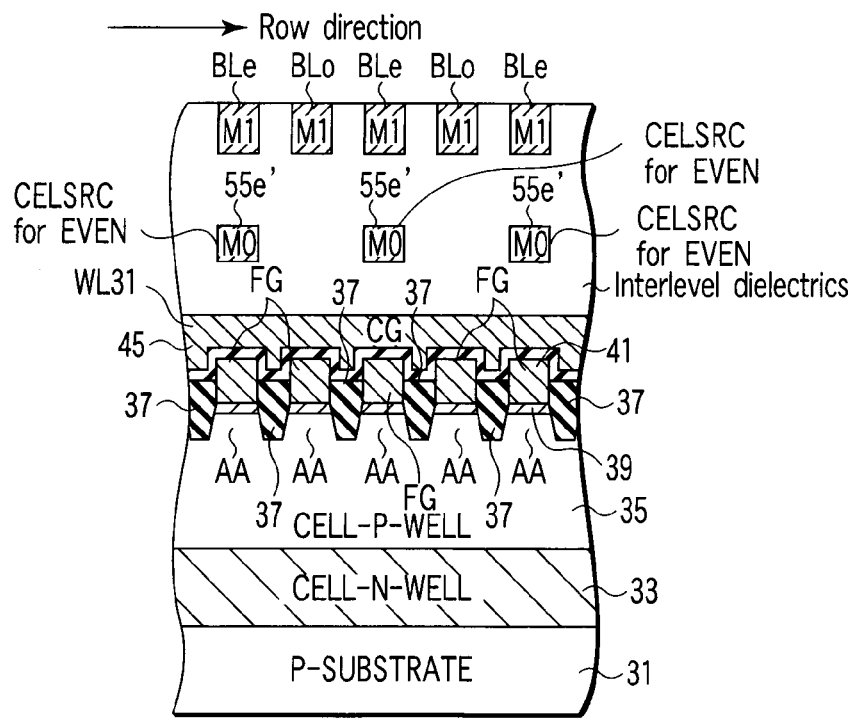
FIG. 18 is a cross-sectional view taken along the 18-18 line of FIG. 12.

FIG. 12 is a plan view showing one example of a plane pattern of a semiconductor integrated circuit device according to the third embodiment of this invention. FIG. 13 is a cross-sectional view taken along the 13-13 line of FIG. 12, FIG. 14 is a cross-sectional view taken along the 14-14 line of FIG. 12, FIG. 15 is a cross-sectional view taken along the 15-15 line of FIG. 12, FIG. 16 is a cross-sectional view taken along the 16-16 line of FIG. 12, FIG. 17 is a cross-sectional view taken along the 17-17 line of FIG. 12, and FIG. 18 is a cross-sectional view taken along the 18-18 line of FIG. 12.

As shown in FIGS. 12 to 18, for example, a cell N-well (CELL-N-WELL) 33 and cell P-well (CELL-P-WELL) 35 are sequentially formed on a P-type semiconductor substrate (P-SUBSTRATE), for example, P-type silicon substrate 31. The cell N-well 33 electrically separates the cell P-well 35 from the substrate 31.

In the surface region of the substrate 31, in this example, in the surface region of the cell P-well 35, element isolation insulating films 37 are formed. One example of the element isolation insulating film is a shallow trench isolation (STI) film. The element isolation insulating films isolate active regions AA in the surface region of the substrate 31, in this example, in the surface region of the cell P-well 35.

Gate insulating films 39 are formed on the active regions AA. One example of the gate insulating film 39 is an silicon dioxide film. Floating gates (FG) 41 are formed on the gate insulating films 39. One example of the floating gate 41 is a conductive polysilicon film. Gate-gate insulating films 43 are formed on the floating gates 41. One example of the gate-gate insulating film 43 is a three-layered film (ONO film) with a silicon nitride film/silicon dioxide film/silicon nitride film. Control gates 45 are formed on the gate-gate insulating films 43. One example of the control gate 45 is a laminated film (polycide film) with a conductive polysilicon film/metal silicide film.

The gate electrode of each memory cell transistor MT is configured by a laminated structure of the floating gate 41, gate-gate insulating film 43 and control gate 45. Each control gate 45 is commonly used by the memory cell transistors MT which are adjacent in the row direction and functions as a word line WL.

Likewise, the gate electrode of each selection transistor ST is configured by a laminated structure having a conductive film 41' which is the same as the floating gate 41, an insulating film 43' which is the same as the gate-gate insulating film 43 and a conductive film 45' which is the same as the control gate 45. Each insulating film 43' of this example has an opening 47 and the conductive film 45' is electrically connected to the conductive film 41' via the opening 47. The conductive films

45' and 41' are commonly used by the selection transistors ST which are adjacent in the row direction and function as first selection gate lines SGD for EVEN/SGS for ODD or second selection gate lines SGS for EVEN/SGD for ODD.

N-type source/drain diffusion layers 49 are formed in portions of the active regions AA which lie under between the gate electrodes of the memory cell transistors MT and portions thereof which lie under between the gate electrodes of the memory cell transistors MT and the gate electrodes of the selection transistors ST. Likewise, N-type source/drain diffusion layers 49' are formed in portions which lie under between the gate electrodes of the selection transistors ST.

The N-type source/drain diffusion layers 49' are electrically connected to plugs 51. One example of the plug 51 is a metal film. One example of the metal film is a titanium film, tungsten film or the like.

The plug 51 connected to the diffusion layer 49' of the selection transistor ST1e is electrically connected to an even-numbered local internal wiring 53e. One example of the wiring 53e is a metal film. One example of the metal film is an aluminum film, copper film or the like. The plug 51 connected to the diffusion layer 49' of the selection transistor ST2e is electrically connected to an even-numbered cell source line CELSRC for EVEN. One example of the even-numbered cell source line CELSRC for EVEN is a metal film. One example of the metal film is an aluminum film, copper film or the like.

Further, the plug 51 connected to the diffusion layer 49' of the selection transistor ST1o is electrically connected to an odd-numbered cell source line CELSRC for ODD. One example of the odd-numbered cell source line CELSRC for ODD is the same as that of the even-numbered cell source line CELSRC for EVEN. The plug 51 connected to the diffusion layer 49' of the selection transistor ST2o is electrically connected to an odd-numbered local internal wiring 53o. One example of the odd-numbered local internal wiring 53o is the same as that of the even-numbered local internal wiring 53e.

In this example, the cell source lines CELSRC for EVEN and CELSRC for ODD are formed on the same plane as the local internal wirings 53e and 53o. The above lines and wirings are formed by using the same conductive film.

In this example, since the cell source lines CELSRC for EVEN and CELSRC for ODD are formed on the same plane as the local internal wirings 53e and 53o, the following design is made on the pattern.

That is, in-bit local portions and bit-common portions are provided in the cell source lines CELSRC. The in-bit local portion is formed along the local internal wiring 53 to extend in a direction parallel to the local internal wiring 53. The bit-common portion is formed in a portion in which the local internal wiring 53 is not formed and extends in a direction which crosses the local internal wiring 53. One example is shown by the plan view of FIG. 12.

For example, as one example, an odd-numbered bit-common portion 55o and even-numbered bit-common portion 55e are formed in a direction to cross local internal wirings 53e, 53o in a portion in which the local internal wiring 53e, 53o are not formed. Odd-numbered in-bit local portions 55o' are formed to extend from the odd-numbered bit-common portion 55o and lie between the even-numbered local internal wirings 53e in a direction parallel to the wiring 53e. Likewise, even-numbered in-bit local portions 55e' are formed to extend from the even-numbered bit-common portion 55e and lie between the odd-numbered local internal wirings 53o in a direction parallel to the wiring 53o.

By forming the above pattern, the cell source lines CELSRC for EVEN and CELSRC for ODD can be formed on the same plane as the local internal wirings 53e and 53o.

The local internal wirings 53e are electrically connected to plugs 57. Likewise, the local internal wirings 53o are electrically connected to the plugs 57. One example of the plug 57 is the same as the plug 51.

The plug 57 connected to the local internal wiring 53e is electrically connected to the even-numbered bit line BLe. Likewise, the plug 57 connected to the local internal wiring 53o is electrically connected to the odd-numbered bit line BLo.

The bit lines BLe, BLo are formed above the local internal wirings 53e, 53o and extend in the same column direction as the wirings 53e, 53o.

Thus, the bit lines BLe, BLo are formed above the cell source lines CELSRC for EVEN and CELSRC for ODD. Therefore, it is possible to form the bit-common portions 55e, 55o extending in the row direction on the cell source lines CELSRC for EVEN and CELSRC for ODD.

The bit lines BLe, BLo, cell source lines CELSRC for EVEN and CELSRC for ODD, local internal wirings 53e, 53o, word lines WL, first selection gate lines SGD for EVEN/SGS for ODD and second selection gate lines SGS for EVEN/SGD for ODD are isolated from one another by use of inter-level dielectrics.

According to the third embodiment, the circuit of one example shown in the second embodiment can be realized as an actual device.

Fourth Embodiment

A fourth embodiment relates to one example of a case wherein the memory cell array is realized by use of the device of one example shown in the third embodiment.

Figure 19:
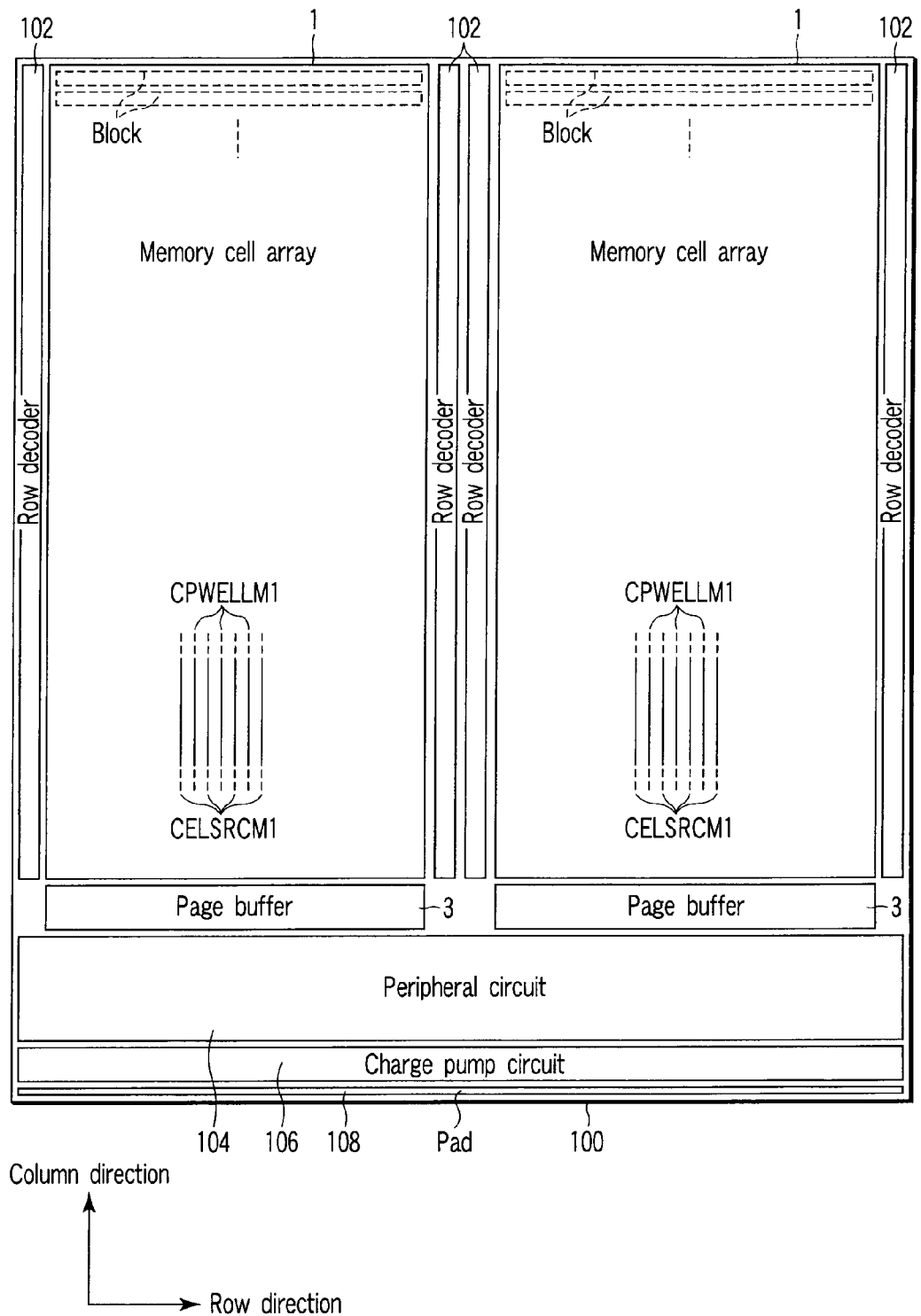
FIG. 19 is a plan view showing one example of the chip layout of a semiconductor integrated circuit device according to a fourth embodiment of this invention.

FIG. 19 is a plan view showing one example of the chip layout of a semiconductor integrated circuit device according to the fourth embodiment of this invention. The semiconductor integrated circuit device shown in FIG. 19 is a NAND type flash memory, for example.

As shown in FIG. 19, for example, two memory cell arrays 1 are arranged on a semiconductor chip, for example, silicon chip 100. For example, row decoders 102 are arranged on both end portions of each of the memory cell arrays 1 extending in the column direction. On one-side end portions of the memory cell arrays 1 in the row direction, for example, page buffers 3, memory peripheral circuit 104, charge pump circuit 106 and pad portion 108 are sequentially arranged. In the memory peripheral circuit 104, a circuit containing a command decoder and memory cell array control circuit is arranged and, in the charge pump circuit 106, capacitors and transistors used in a booster circuit (charge pump circuit) are arranged. In the pad portion 108, terminals (pads) used as terminal points for connection between the chip and the exterior are arranged.

When the memory cell is formed of a NAND type, a high voltage (which is hereinafter referred to as an erase voltage) is applied to a cell P-well (CELL-P-WELL) 35 at the data erase time. The erase voltage is generated by the booster circuit in the charge pump circuit 106 and transferred to the memory cell array 1 via a cell well line CPWELLM1 extending in the column direction. The cell well line CPWELLM1 is formed of the same metal layer (M1) as the bit lines BLe, BLo shown in FIGS. 12 to 18 to extend parallel to the bit lines BLe, BLo on the memory cell array 1, for example, and one cell well line is provided for every several hundred to several thousand bytes of bit lines.

Further, in the fourth embodiment, global cell source lines CELSRCM1 are formed on the memory cell array 1. For example, the global cell source line CELSRCM1 is used to transmit source potential from a cell source line driving circuit 9 in the peripheral circuit 104 to cell source lines CELSRC for EVEN, CELSRC for ODD in the memory cell array 1. The global cell source line CELSRCM1 is formed of the metal layer (M1), for example. Like the cell well line CPWELLM1, for example, the global cell source line is formed to extend parallel to the bit lines BLe, BLo and one global cell source line is provided for every several hundred to several thousand bytes of bit lines. In this example, for example, the global cell source lines CELSRCM1 and cell well lines CPWELLM1 are alternately arranged.

Figure 20:
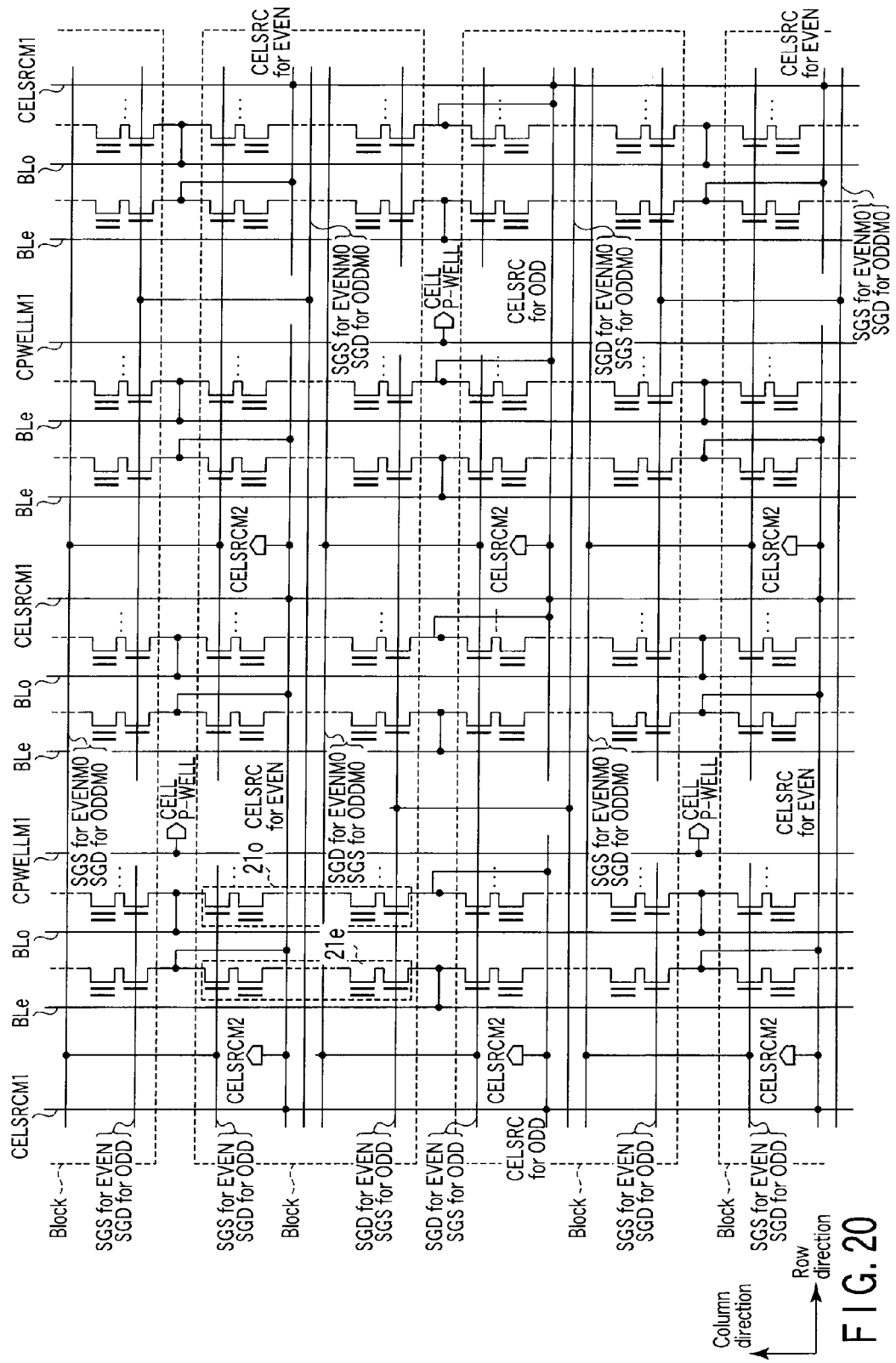
FIG. 20 is a circuit diagram showing an example of a circuit of a memory cell array shown in FIG. 19.

FIG. 20 is a circuit diagram showing an example of a circuit of the memory cell array shown in FIG. 19.

The circuit example shown in FIG. 20 is the same circuit as that explained with reference to FIG. 19.

However, the present circuit example is different from that explained with reference to FIG. 19 in the following respects. Two representative differences are pointed out and the circuit example is explained as first and second circuit configuration examples. Further, one configuration example of a memory cell array attained when the present circuit example is integrated is explained as a layout example.

First Circuit Configuration Example

In the first circuit configuration example, the global cell source line has a multi-layered wiring structure, for example, a double-layered structure having CELSRCM1 and CELSRCM2.

If the global cell source line is formed with the multi-layered wiring structure, the resistance of the global cell source line can be reduced. For example, global cell source lines CELSRCM1 which are independent in the row direction are connected to one another in the row direction by use of global cell source lines CELSRCM2 formed above the global cell source lines CELSRCM1 in the memory cell array 1. Thus, it becomes possible to attain an advantage that the resistances of the global cell source lines and cell source lines can be reduced.

For example, the cell source lines CELSRC for EVEN/ CELSRC for ODD which lie below the global cell source lines CELSRCM1 are arranged independently of one another in the column direction. That is, the cell source lines CELSRC for EVEN, CELSRC for ODD are connected in parallel with the global cell source lines CELSRCM2. Therefore, the cell source lines CELSRC for EVEN, CELSRC for ODD are shunted by the global cell source lines CELSRCM2 and, as a result, the resistance of the cell source lines CELSRC for EVEN, CELSRC for ODD can be reduced.

Likewise, the global cell source lines CELSRCM1 are arranged independently of one another in the row direction. Therefore, the global cell source lines CELSRCM1 are connected in parallel with the global cell source lines CELSRCM2 by use of the global cell source lines CELSRCM2. Thus, the global cell source lines CELSRCM1 are also shunted by the global cell source lines CELSRCM2 and, as a result, the resistance of the global cell source lines CELSRCM1 can be reduced.

Second Circuit Configuration Example

In the second circuit configuration example, the selection gate lines SGD for EVEN/SGS for ODD and SGS for EVEN/ SGD for ODD are respectively shunted by the selection gate lines SGD for EVENM0/SGS for ODDM0 and SGS for EVENM0/SGD for ODDM0.

The advantage attained by the above configuration is that the resistances of the selection gate lines SGD for EVEN/SGS for ODD and SGS for EVEN/SGD for ODD can be reduced. Further, the present example has a circuit configuration in which the selection gate lines SGD for EVEN/SGS for ODD and SGS for EVEN/SGD for ODD are cut apart in contact portions (cell P-well contacts) between the cell well lines CPWELLM1 and cell P-wells. The cell P-well contact lies under the cell well line CPWELLM1, for example. In this case, there is provided an advantage that the selection gate lines SGD for EVEN/SGS for ODD and SGS for EVEN/SGD for ODD which are cut apart can be kept connected by use of the selection gate lines SGD for EVENM0/SGS for ODDM0 and SGS for EVENM0/SGD for ODDM0.

In this example, the selection gate lines SGD for EVENM0/SGS for ODDM0 and SGS for EVENM0/SGD for ODDM0 are formed of the same metal layer (M0) as the cell source lines CELSRC for EVEN, CELSRC for ODD. In this case, for example, the cell source lines CLSRC for EVEN, CELSRC for ODD are cut apart in connecting portions between the selection gate lines SGD for EVENM0/SGS for ODDM0 and the selection gate lines SGD for EVEN/SGS for ODD. The connecting portions lie under the cell well lines CPWELLM1 and global cell source lines CELSRCM1. As described above, the cell source lines CELSRC for EVEN, CELSRC for ODD are shunted by the global cell source lines CELSRCM2. That is, the global cell source line CELSRCM2 has a function of connecting the cut-off cell source lines CELSRC for EVEN, CELSRC for ODD together.

Layout Example

Figure 21:
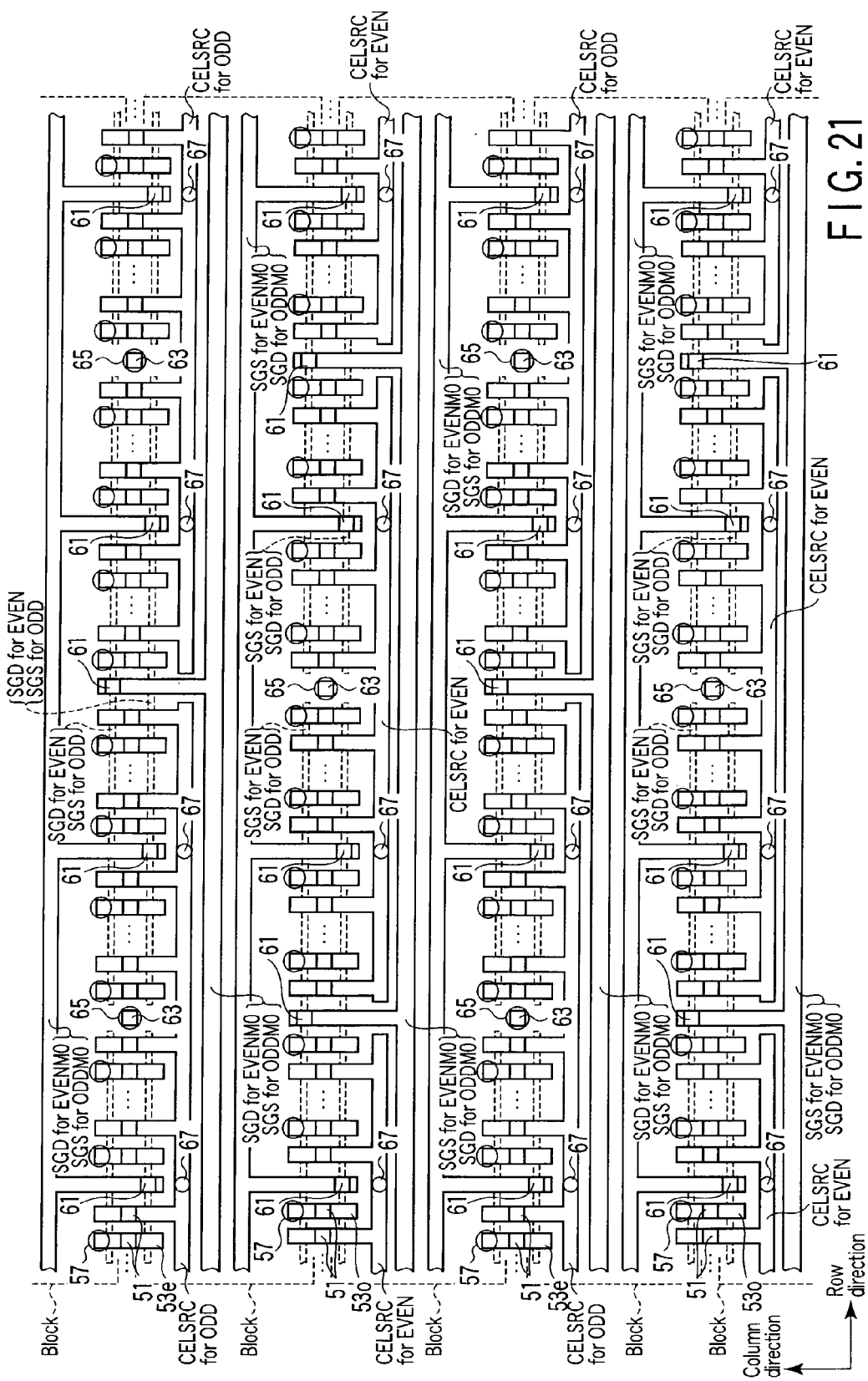
FIG. 21 is a plan view showing an M0 layout example of the circuit example shown in FIG. 20.
Figure 22:
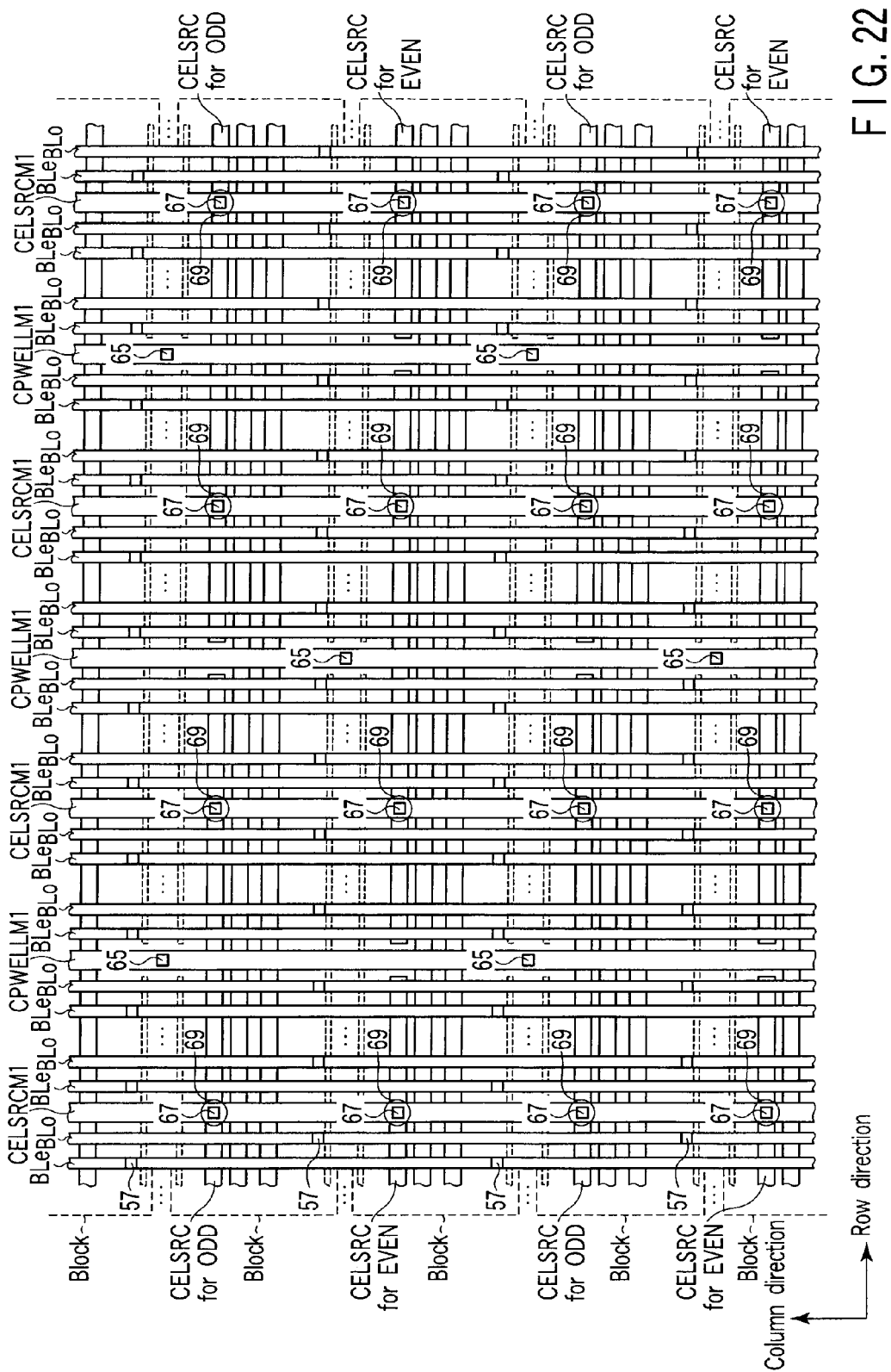
FIG. 22 is a plan view showing an M1 layout example of the circuit example shown in FIG. 20.
Figure 23:
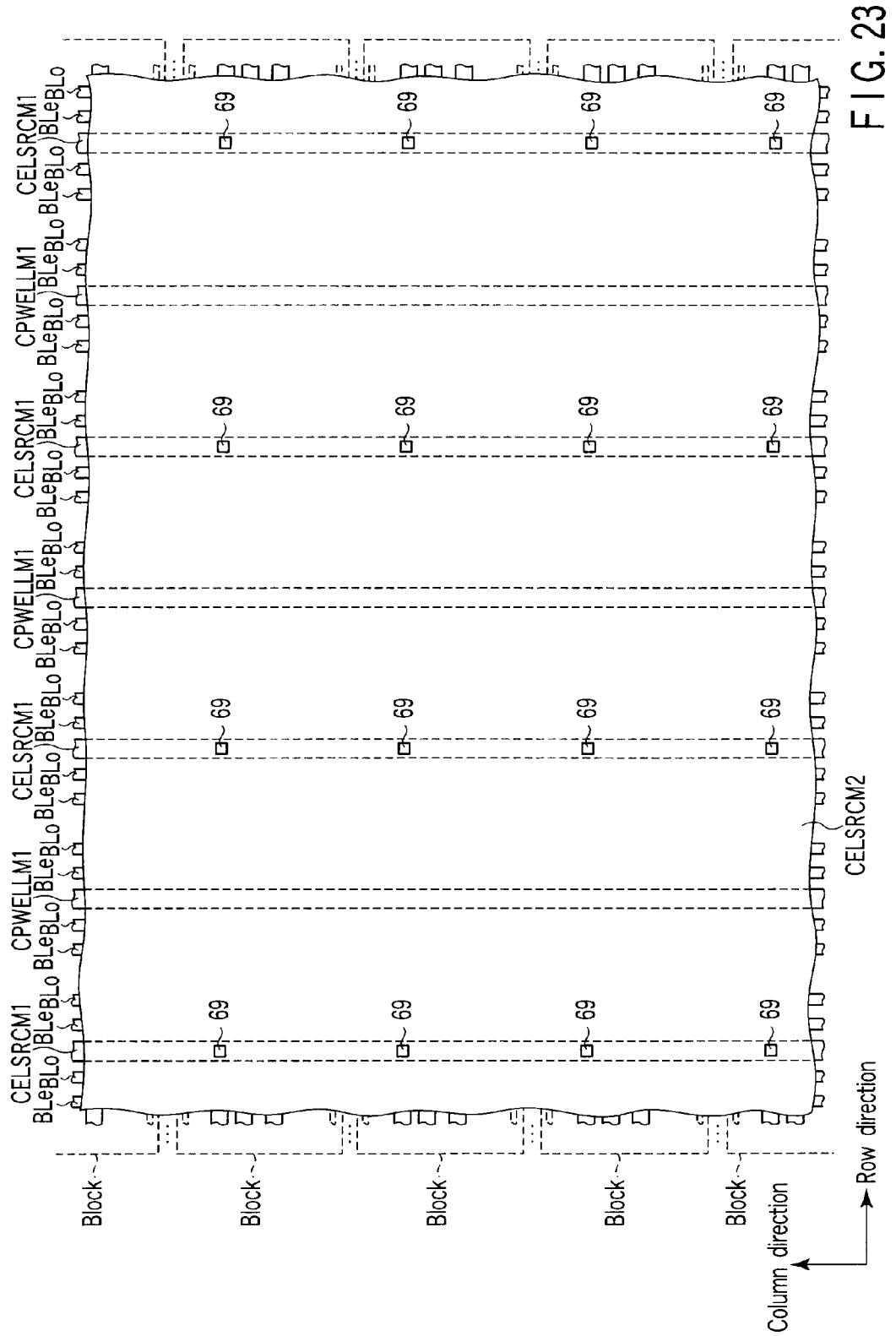
FIG. 23 is a plan view showing an M2 layout example of the circuit example shown in FIG. 20.

FIGS. 21 to 23 are plan views showing a configuration example of the circuit shown in FIG. 20. FIG. 21 shows a layout example of a first-layered metal M0, FIG. 22 shows a layout example of a second-layered metal M1 and FIG. 23 shows a layout example of a third-layered metal M3.

As shown in FIG. 21, the first-layered metal M0 is mainly used for the following wirings (1 to 7) on the memory cell array 1.

(1) Selection gate lines SGD for EVENM0/SGS for ODDM0

(2) Selection gate lines SGS for EVENM0/SGD for ODDM0

(3) Even-numbered cell source lines CELSRC for EVEN (4) Odd-numbered cell source lines CELSRC for ODD (5) Even-numbered local internal wirings 53$e$ (6) Even-numbered local internal wirings 53$o$ (7) Cell well line-Cell P-well intermediate wirings 63

Wiring 1, that is, the selection gate line SGD for EVENM0/ SGS for ODDM0, is connected to the first selection gate line SGD for EVEN/SGS for ODD (refer to FIGS. 12 to 14 for the detail explanation) via the plug 61.

Wiring 2, that is, the selection gate line SGS for EVENM0/ SGD for ODDM0, is connected to the second selection gate line SGS for EVEN/SGD for ODD (refer to FIGS. 12 to 14 for the detail explanation) via the plug 61.

Wirings 3 to 6 are as described above.

Wiring 7, that is, the cell well line-cell P-well intermediate line 63, is a portion in which the cell well line CPWELLM1 (second-layered metal M1) is temporarily held in the first-layered metal when it is connected to the cell P-well 35. The cell well line CPWELLM1 is connected to the cell P-well 35 via the intermediate wiring 63. Various examples of connections between the intermediate wiring 63 and the cell P-well 35 are provided. For the connections, all of the connections described in Jpn. Pat. Appln. KOKAI Publication No. 2000-

91546 (corresponding U.S. Pat. No. 6,353,242) can be used, for example. Therefore, detailed explanation of the connection is omitted in this specification.

U.S. Pat. No. 6,353,242, the entire contents of this reference are incorporated herein by reference.

As shown in FIG. 22, the second-layered metal M1 is mainly used for the following wirings (8 to 11) on the memory cell array 1.

(8) Even-numbered bit lines BLe
(9) Odd-numbered bit lines BLo
(10) Cell well lines CPWELLM1
(11) Global cell source lines CELSRCM1

Wirings 8 and 9 are as described above.

Wiring 10, that is, the cell well line CPWELLM1, is connected to the intermediate line 63 via the plug 65.

Wiring 11, that is, the global cell source line CELSRCM1, is connected to the even-numbered cell source line CELSRC for EVEN and odd-numbered cell source line CELSRC for ODD via the plug 67.

The plugs 65, 67 can be formed of the same conductive layer as the plug 57.

As shown in FIG. 23, the third-layered metal M2 is mainly used for the following wiring (12) on the memory cell array 1.

(12) Global cell source lines CELSRCM2

Wiring 12, that is, the global cell source line CELSRCM2, is connected to the global cell source line CELSRCM1 via the plug 69.

The global cell source line CELSRCM2 is formed in a single sheet-like form on the memory cell array 1, for example. By forming the global cell source line in the single sheet-like form, the global cell source lines CELSRCM1 and the even-numbered cell source lines CELSRC for EVEN and odd-numbered cell source lines CELSRC for ODD which intersect the global source lines can be shunted by the global cell source line CELSRCM2.

Figure 24:
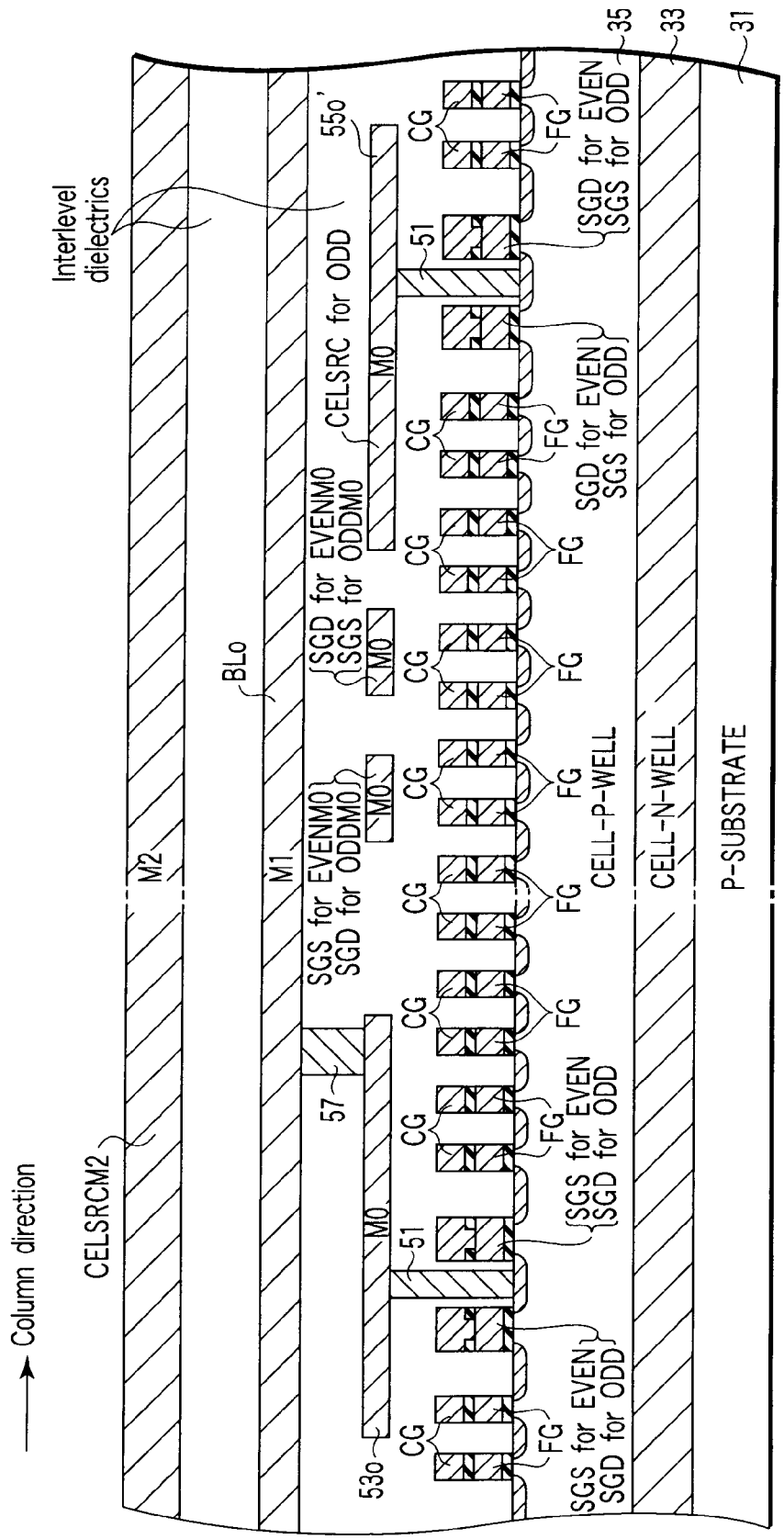
FIG. 24 is a cross-sectional view taken along a bit line in the layout example shown in FIGS. 21 to 23.
Figure 25:
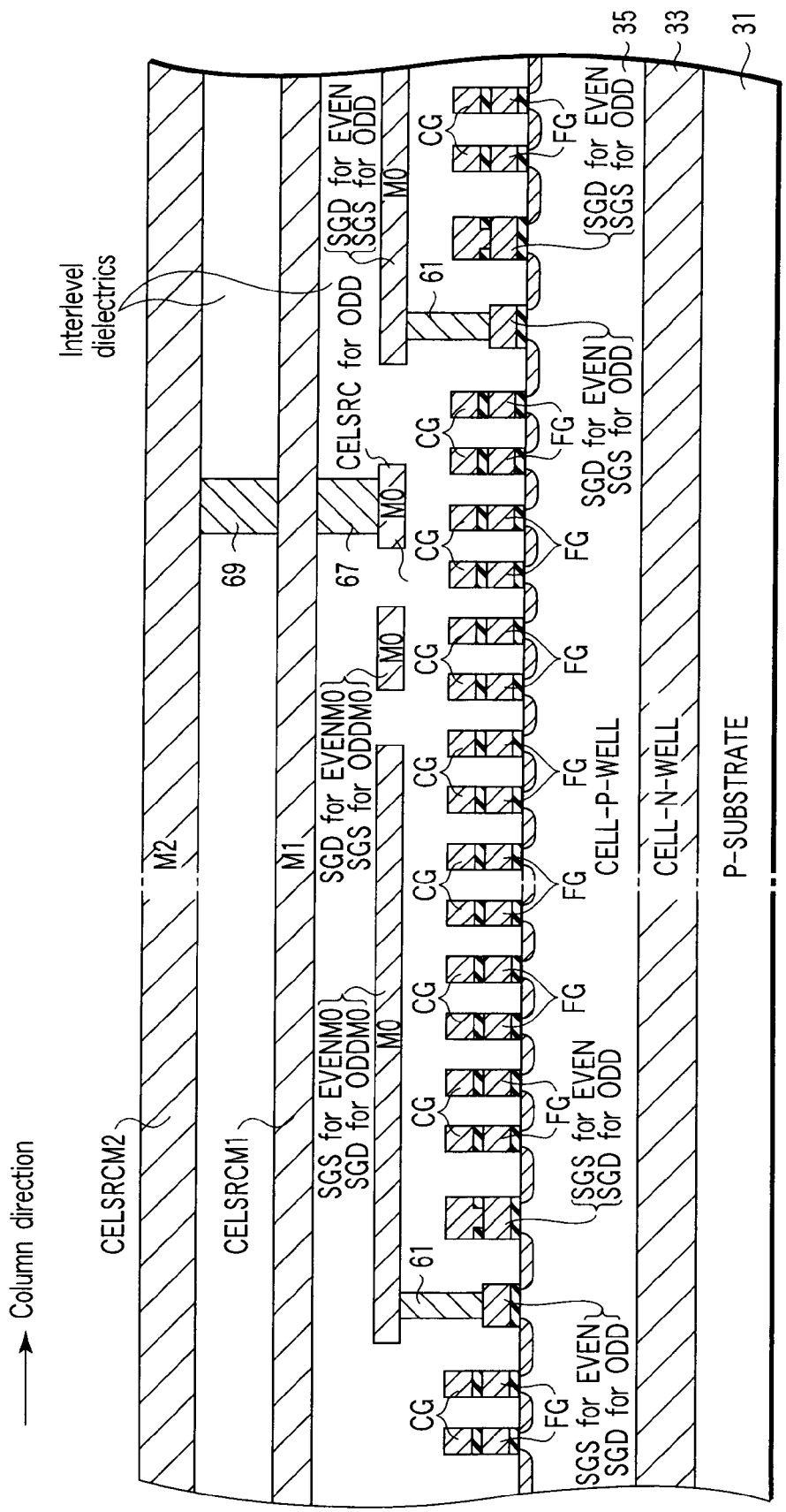
FIG. 25 is a cross-sectional view taken along a global cell source line in the layout example shown in FIGS. 21 to 23.

FIGS. 24, 25 are cross-sectional views showing examples of the cross sections of the layout examples shown in FIGS. 21 to 23.

FIG. 24 shows a cross section taken along the bit line BL (for example, odd-numbered bit line BLo) and FIG. 25 shows a cross section taken along the global cell source line CELSRCM1. In the drawings, for example, the same reference symbols are attached to the same portions as those of FIG. 14 and FIGS. 21 to 23 and explanation thereof is omitted.

Thus, according to the fourth embodiment, one configuration example of the memory cell array using the device according to one example of the third embodiment can be realized.

Fifth Embodiment

A fifth embodiment relates to the improvement of one configuration example explained in the fourth embodiment. Particularly, an attempt is made to further reduce the resistances of the even-numbered cell source line CELSRC for EVEN and odd-numbered cell source line CELSRC for ODD.

In the devices explained in the first to third embodiments, for example, a potential which suppresses programming is transferred to an unselect NAND string (which is 21e or 21o) existing in the selected block by use of the even-numbered cell source line CELSRC for EVEN and odd-numbered cell source line CELSRC for ODD at the programming operation time. In short, the channel of the unselect NAND string is charged by use of the even-numbered cell source line CELSRC for EVEN and odd-numbered cell source line CELSRC for ODD.

The operation of charging the channel of the unselect NAND string plays an important role in enhancing the programming operation. That is, as the charging operation is completed earlier, the programming operation speed can be more easily enhanced.

In order to enhance the charging operation speed, the resistances of the even-numbered cell source line CELSRC for EVEN and odd-numbered cell source line CELSRC for ODD may be reduced. For example, in the fourth embodiment, the resistances are reduced by shunting the even-numbered cell source line CELSRC for EVEN and odd-numbered cell source line CELSRC for ODD by mainly using the global cell source line CELSRCM2.

In the fifth embodiment, an attempt is made to further reduce the resistances.

In the fourth embodiment, the connecting portion (for example, a portion in which the plug 67 exists) between the global cell source line CELSRCM2 and the even-numbered cell source line CELSRC for EVEN or odd-numbered cell source line CELSRC for ODD is an intersection between the global cell source line CELSRCM1 and the even-numbered cell source line CELSRC for EVEN or odd-numbered cell source line CELSRC for ODD. In short, the connecting portion lies under the global cell source line CELSRCM1.

In the fifth embodiment, the connecting portions are set not only under the global cell source lines CELSRCM1 but also under the cell well lines CPWELLM1. As a result, the number of connecting portions is increased and the resistances of the even-numbered cell source line CELSRC for EVEN and odd-numbered cell source line CELSRC for ODD can be further reduced.

Figure 27:
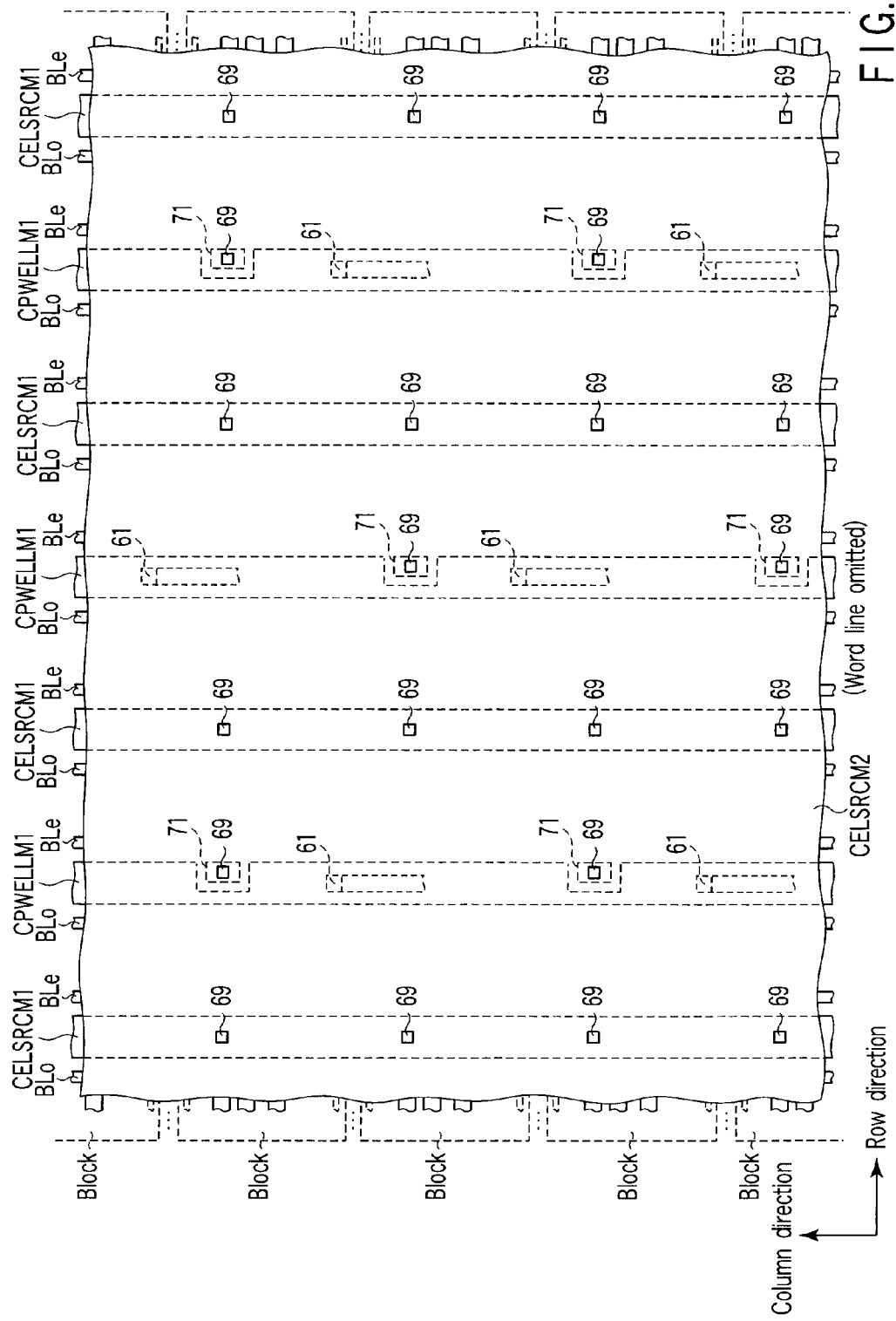
FIG. 27 is a plan view showing an M2 layout example of the semiconductor integrated circuit device according to the fifth embodiment.

FIGS. 26 and 27 are plan views each showing one configuration example of a semiconductor integrated circuit device according to the fifth embodiment.

FIG. 26 shows a layout example of a second-layered metal M1 and FIG. 27 shows a layout example of a third-layered metal M2.

As shown in FIG. 26, in the fifth embodiment, the connecting portions between the global cell source lines CELSRCM2 and the even-numbered cell source lines CELSRC for EVEN or odd-numbered cell source lines CELSRC for ODD are provided at the intersections between the cell well lines CPWELLM1 and the even-numbered cell source lines CELSRC for EVEN or odd-numbered cell source lines CELSRC for ODD. For this purpose, for example, portions of the cell well lines CPWELLM1 are cut away and intermediate wirings 71 which are electrically isolated from the cell well lines CPWELLM1 are provided in the respective cut-away portions. For example, the intermediate wirings 71 can be formed of the same second-layered metal M1 as the cell well line CPWELLM1. The intermediate wiring 71 is connected to the even-numbered cell source line CELSRC for EVEN or odd-numbered cell source line CELSRC for ODD via the plug 67.

As shown in FIGS. 26, 27, for example, the plugs 67 and intermediate wirings 71 (which are hereinafter referred to as cell source line contacts) are formed in a zigzag form on the memory cell array 1. One of the reasons is that portions lying under the cell well lines CPWELLM1 are used as connecting portions (which are hereinafter referred to as selection gate line contacts) between the selection gate lines SGD for EVENM0/SGS for ODDM0 and the first selection gate lines SGD for EVEN/SGS for ODD and connecting portions (which are hereinafter referred to as selection gate line contacts) between the selection gate lines SGS for EVENM0/SGD for ODDM0 and the second selection gate lines SGS for EVEN/SGD for ODD. If source line contacts are formed on all of the intersects between the cell well lines CPWELLM1 and the even-numbered cell source lines CELSRC for EVEN or odd-numbered cell source lines CELSRC for ODD, there will be no space in which selection gate line contacts are formed. Therefore, for example, the source line contacts and selection gate line contacts are alternately arranged under the cell well lines CPWELLM1. As a result, selection gate line contacts can be formed.

As one example of the plane pattern, for example, as shown in FIG. 27, source line contacts (corresponding to portions indicated by reference symbol 69) and selection gate line contacts (corresponding to portions indicated by reference symbol 61) are arranged in a zigzag form under the cell well lines CPWELLM1.

Figure 28:
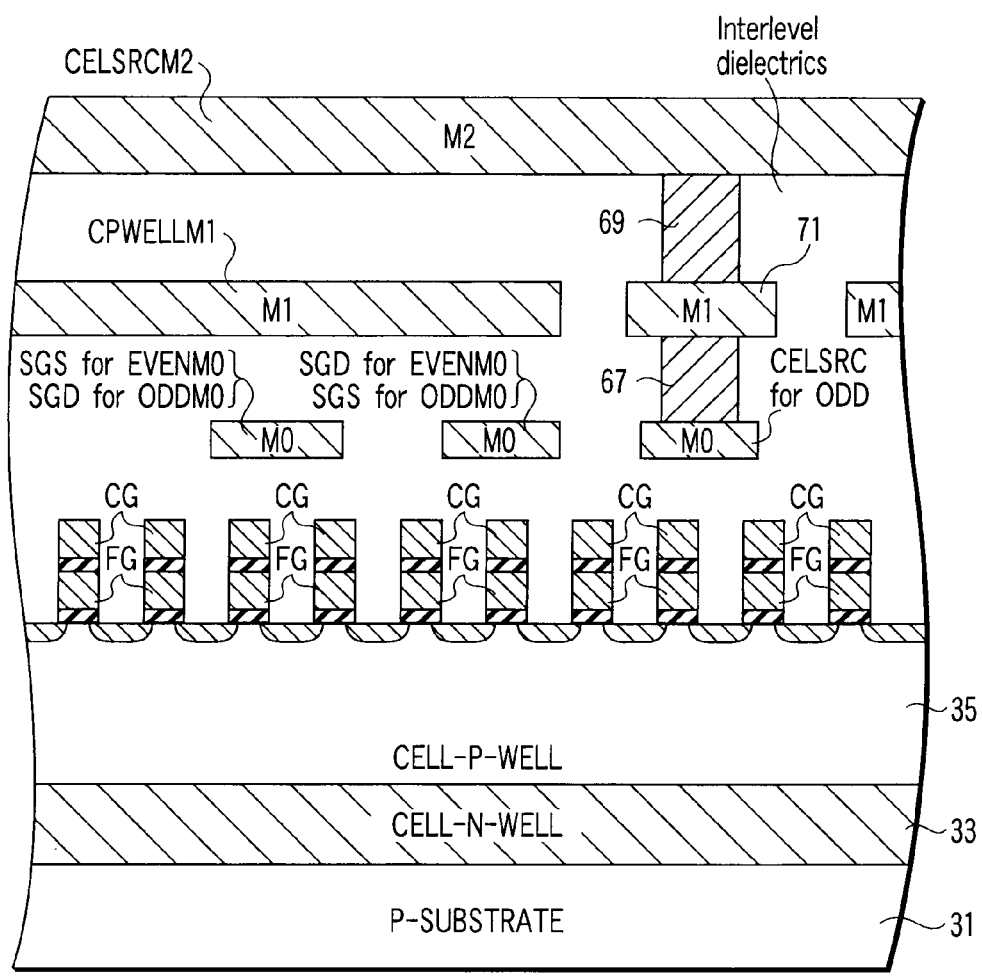
FIG. 28 is a cross-sectional view taken along a cell well line of the layout example shown in FIGS. 26 and 27.

FIG. 28 is a cross-sectional view of the layout example shown in FIGS. 26 and 27.

FIG. 28 shows a cross section taken along the cell well line CPWELLM1. In FIG. 28, for example, portions which are the same as those shown in FIG. 14 and FIGS. 21 to 25 are denoted by the same reference symbols and explanation thereof is omitted.

Thus, according to the fifth embodiment, the resistances of the even-numbered cell source line CELSRC for EVEN and odd-numbered cell source line CELSRC for ODD can be further reduced. For example, an advantage that the operation speed of the programming operation can be easily enhanced can be attained.

In the fifth embodiment, for example, it may be necessary to increase the width of the cell well line CPWELLM1 in the row direction in order to form the intermediate wiring 71.

In the fourth embodiment, since the intermediate wiring 71 is not formed, an advantage that the width of the cell well line CPWELLM1 in the row direction can be reduced can be attained. That is, in the fourth embodiment, the memory cell array 1 can be integrated with higher integration density in comparison with the fifth embodiment.

Therefore, the fourth and fifth embodiments can be adequately selected and used according to whether the program operation speed is enhanced or the integration density of the memory cell array 1 is enhanced.

Sixth Embodiment

Like the fifth embodiment, a sixth embodiment is to further reduce the resistances of the even-numbered cell source line CELSRC for EVEN and odd-numbered cell source line CELSRC for ODD and is another example in which the resistance can be further reduced.

Figure 29:
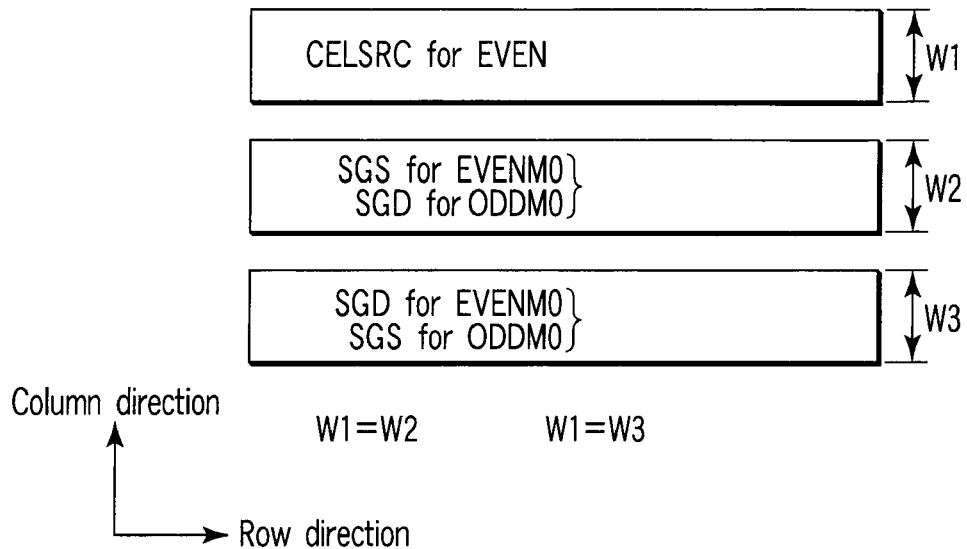
FIG. 29 is a plan view showing the relation between the width of a cell source line (M0) and the width of a selection gate line (M0) in the semiconductor integrated circuit device according to the third to fifth embodiments.

In the third to fifth embodiments, as shown in FIG. 29, the width W1 of the even-numbered cell source line CELSRC for EVEN (or odd-numbered cell source line CELSRC for ODD) in the column direction is set equal to the width W2 of the selection gate line SGS for EVENM0/SGD for ODDM0 in the column direction and the width W3 of the selection gate line SGD for EVENM0/SGS for ODDM0 in the column direction (W1=W2, W1=W3).

Figure 30:
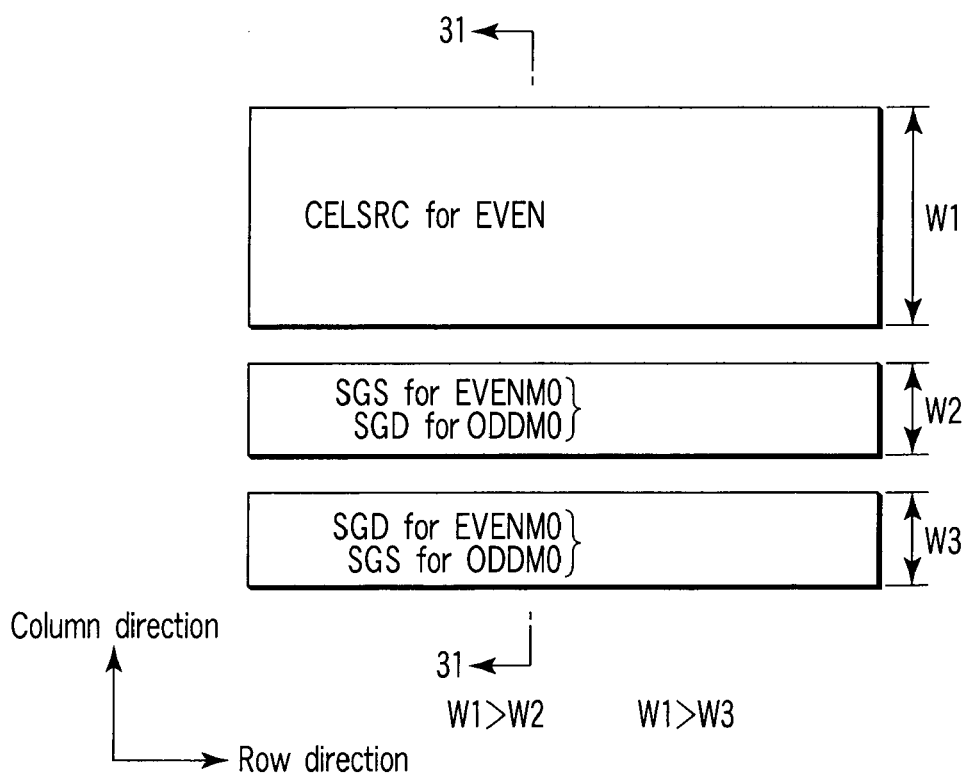
FIG. 30 is a plan view showing the relation between the width of a cell source line (M0) and the width of a selection gate line (M0) in a semiconductor integrated circuit device according to a sixth embodiment of this invention.

In the sixth embodiment, as shown in FIG. 30, the width W1 is made larger than the widths W2 and W3 (W1>W2, W1>W3).

By setting the relation of W1>W2, W1>W3, the resistance of the even-numbered cell source line CELSRC for EVEN (or odd-numbered cell source line CELSRC for ODD) can be further reduced.

Modification

Figure 31:
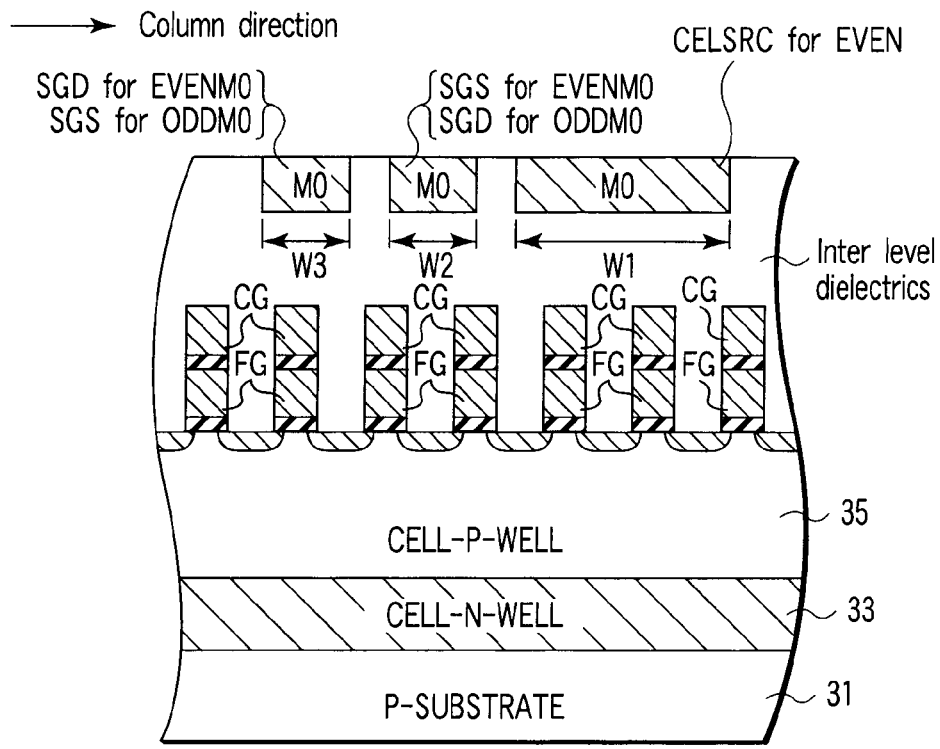
FIG. 31 is a cross-sectional view taken along the 31-31 line in FIG. 30.

FIG. 31 is a cross-sectional view taken along the 31-31 line in FIG. 30.

Figure 32:
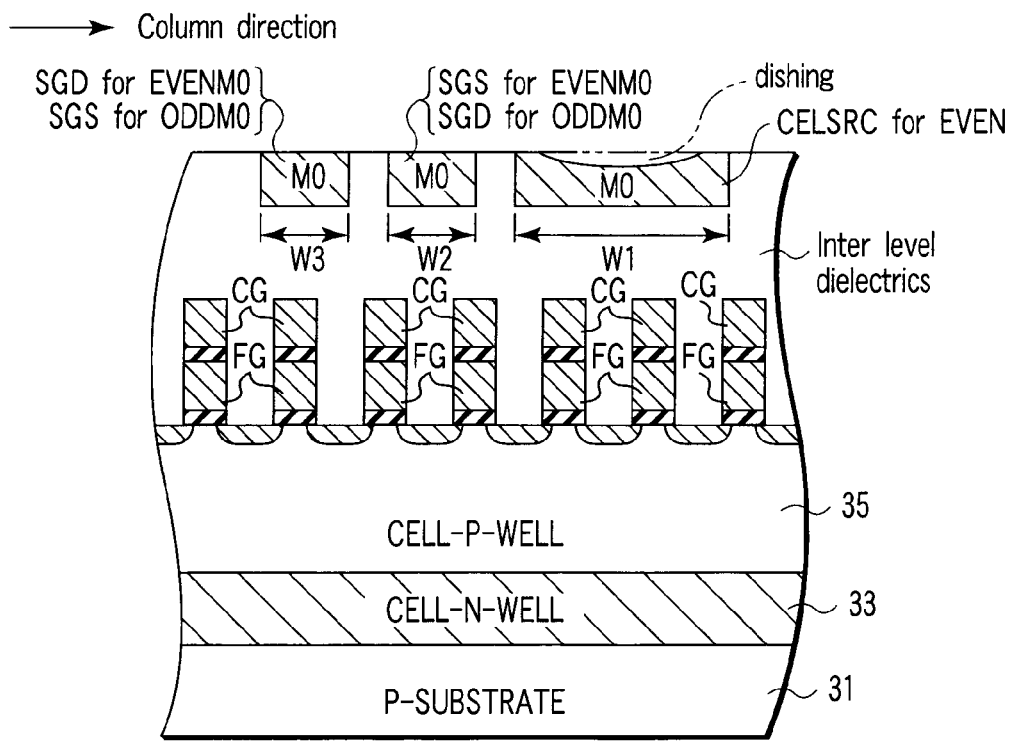
FIG. 32 is a cross-sectional view showing occurrence of dishing.

As shown in FIG. 31, it is assumed that, for example, the even-numbered cell source lines CELSRC for EVEN (or odd-numbered cell source lines CELSRC for ODD), selection gate lines SGS for EVENM0/SGD for ODDM0 and selection gate lines SGD for EVENM0/SGS for ODDM0 are formed by use of a damascene method when the relation of W1>W2, W1>W3 is set. In this case, as shown in FIG. 32, concave portions called dishing may be formed in the even-numbered cell source line CELSRC for EVEN (or odd-numbered cell source line CELSRC for ODD) in some cases.

Figure 33:
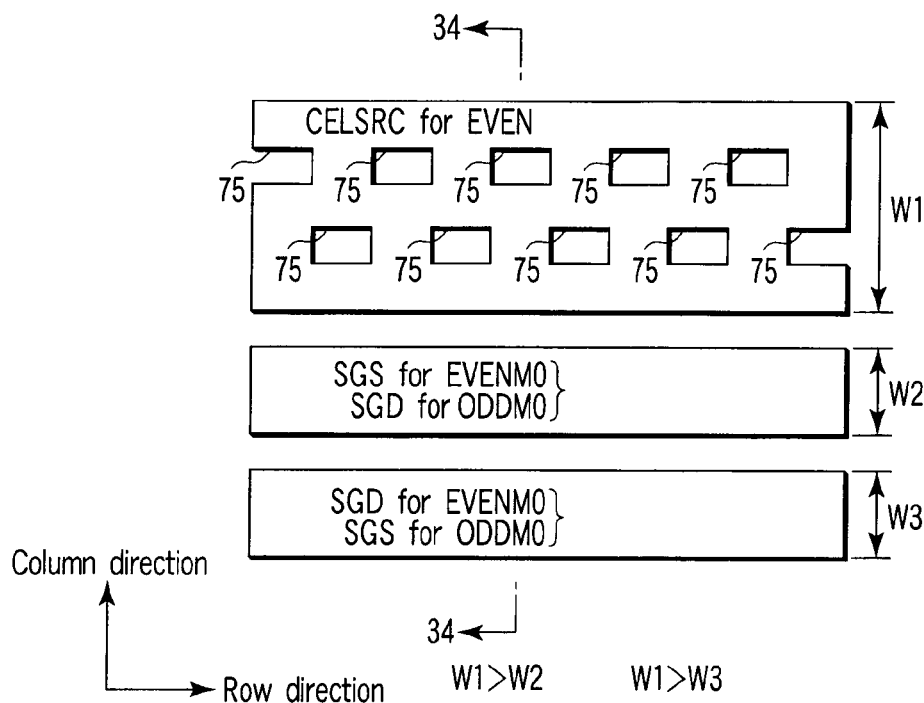
FIG. 33 is a plan view showing the relation between the width of a cell source line (M0) and the width of a selection gate line (M0) in a semiconductor integrated circuit device according to a modification of the sixth embodiment.
Figure 34:
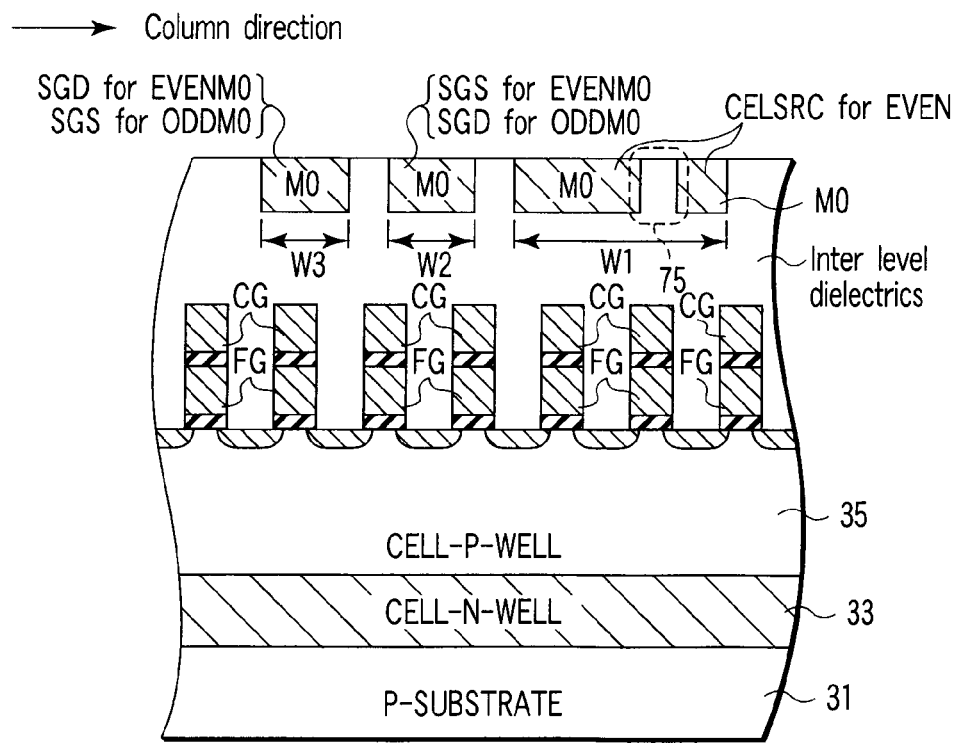
FIG. 34 is a cross-sectional view taken along the 34-34 line of FIG. 33.

In order to suppress occurrence of dishing, for example, as shown in FIG. 33, interlevel dielectrics may be left behind in a zigzag form (a reference symbol 75 is attached to the left-behind portions) on the even-numbered cell source line CELSRC for EVEN (or odd-numbered cell source line CELSRC for ODD) to form the even-numbered cell source line CELSRC for EVEN (or odd-numbered cell source line CELSRC for ODD) into a mesh-form pattern. By thus forming the mesh-form pattern, as shown in the cross section of FIG. 34, the even-numbered cell source line CELSRC for EVEN (or odd-numbered cell source line CELSRC for ODD) is partly divided by the interlevel dielectrics 75 and, therefore, the actual width thereof is made smaller than the width W1.

By thus forming the even-numbered cell source line CELSRC for EVEN (or odd-numbered cell source line CELSRC for ODD) into the mesh-form pattern, occurrence of dishing can be suppressed even in a case where the relation of W1>W2, W1>W3 is set.

According to the first to sixth embodiments of this invention, it is possible to provide a semiconductor integrated circuit device containing a semiconductor memory wherein it is difficult to have an influence on enhancement of the operation speed even if the bit line length is increased and the arrangement pitch of the bit lines is reduced and a data programming method thereof.

As described above, this invention is explained with reference to the first to sixth embodiments, but this invention is not limited to the above embodiments. When embodying this invention, this invention can be variously modified without departing from the technical scope thereof.

Further, the above embodiments can be individually performed, but can be adequately combined and performed.

Inventions of various stages are contained in the above embodiments and inventions of various stages can be extracted by adequately combining a plurality of constituents disclosed in the above embodiments.

Further, in the above embodiments, this invention is explained based on an example in which this invention is applied to a semiconductor integrated circuit device, for example, semiconductor memory, but a semiconductor integrated circuit device containing the above semiconductor memory, for example, a processor, system LSI or the like can be contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
even-numbered bit lines;
odd-numbered bit lines;
cell source lines;
first memory elements electrically connected between the even-numbered bit lines and the cell source lines; and
second memory elements electrically connected between the odd-numbered bit lines and the cell source lines and belonging to the same rows as the first memory elements;
wherein a potential corresponding to data to be programmed is applied to the first memory element via the even-numbered bit line and a potential which suppresses programming is applied to the second memory element via the cell source line while the odd-numbered bit lines are kept in an electrically floating state when data is programmed into the first memory element, and a potential corresponding to data to be programmed is applied to the second memory element via the odd-numbered bit line and a potential which suppresses programming is applied to the first memory element via the cell source line while the even-numbered bit lines are kept in an electrically floating state when data is programmed into the second memory element.

2. The device according to claim 1, wherein the first memory element is a first NAND string, the second memory element is a second NAND string, the first NAND string includes a first bit line-side selection transistor, a first cell source line-side selection transistor and at least one first memory cell transistor serially connected between one end of a current path of the first bit line-side selection transistor and one end of a current path of the first cell source line-side selection transistor, the second NAND string includes a second bit line-side selection transistor, a second cell source line-side selection transistor and at least one second memory cell transistor serially connected between one end of a current path of the second bit line-side selection transistor and one end of a current path of the second cell source line-side selection transistor, the first bit line-side selection transistor and second cell source line-side selection transistor are driven by a first common selection gate signal, the first cell source line-side selection transistor and second bit line-side selection transistor are driven by a second common selection gate signal, and the first and second memory cell transistors are driven by a common row selection signal.

3. The device according to claim 2, wherein the cell source lines contain even-numbered cell source lines and odd-numbered cell source lines, the first bit line-side selection transistors are arranged on the same row as the second cell source line-side selection transistors, the first cell source line-side selection transistors are arranged on the same row as the second bit line-side selection transistors, and the first memory cell transistors are arranged on the same row as the second memory cell transistors.

4. The device according to claim 3, wherein the even-numbered cell source lines and odd-numbered cell source lines intersect the even-numbered bit lines and odd-numbered bit lines.

5. The device according to claim 4, wherein the even-numbered bit lines and odd-numbered bit lines are arranged above the even-numbered cell source lines and odd-numbered cell source lines.

6. The device according to claim 5, wherein the other end of the current path of each of the first bit line-side selection transistors is electrically connected to a corresponding one of even-numbered local internal wirings via a first plug, the even-numbered local internal wiring is electrically connected to the even-numbered bit line via a second plug, the other end of the current path of each of the second cell source line-side selection transistors is electrically connected to a corresponding one of the odd-numbered cell source lines via a third plug, the other end of the current path of each of the second bit line-side selection transistors is electrically connected to a corresponding one of odd-numbered local internal wirings via a fourth plug, the odd-numbered local internal wiring is electrically connected to the odd-numbered bit line via a fifth plug, and the other end of the current path of each of the first cell source line-side selection transistors is electrically connected to a corresponding one of the even-numbered cell source lines via a sixth plug.

7. The device according to claim 6, wherein the even-numbered cell source lines and odd-numbered cell source lines are arranged on the same plane as the even-numbered local internal wirings and odd-numbered local internal wirings, the odd-numbered cell source line includes an odd-numbered in-bit local portion extending in a direction parallel to the even-numbered local internal wirings and an odd-numbered bit-common portion extending in a direction which intersects the even-numbered local internal wirings, and the even-numbered cell source line includes an even-numbered in-bit local portion extending in a direction parallel to the odd-numbered local internal wirings and an even-numbered bit-common portion extending in a direction which intersects the odd-numbered local internal wirings.

8. The device according to claim 7, wherein the even-numbered bit-common portion and odd-numbered bit-common portion have mesh-form opening patterns.

9. The device according to claim 7, wherein the odd-numbered bit-common portions are arranged above the first and second memory cell transistors.

10. A semiconductor integrated circuit device comprising:
even-numbered bit lines;
odd-numbered bit lines;
a page buffer;
a first selection switch circuit which selectively electrically connects the page buffer to one of the even-numbered bit lines and odd-numbered bit lines;
a second selection switch circuit which sets one of the even-numbered bit lines and odd-numbered bit lines into an electrically floating state;
cell source lines;
a cell source line driving circuit which drives the cell source lines by use of different potentials at programming time and read time;
first memory elements connected between the even-numbered bit lines and the cell source lines; and
second memory elements connected between the odd-numbered bit lines and the cell source lines and belonging to the same rows as the first memory elements.

11. The device according to claim 10, wherein the first memory element is a first NAND string, the second memory element is a second NAND string, the first NAND string includes a first bit line-side selection transistor, a first cell source line-side selection transistor and at least one first memory cell transistor serially connected between one end of a current path of the first bit line-side selection transistor and one end of a current path of the first cell source line-side selection transistor, the second NAND string includes a second bit line-side selection transistor, a second cell source line-side selection transistor and at least one second memory cell transistor serially connected between one end of a current path of the second bit line-side selection transistor and one end of a current path of the second cell source line-side selection transistor, the first bit line-side selection transistor and second cell source line-side selection transistor are driven by a first common selection gate signal, the first cell source line-side selection transistor and second bit line-side selection transistor are driven by a second common selection gate signal, and the first and second memory cell transistors are driven by a common row selection signal.

12. The device according to claim 11, wherein the cell source lines contain even-numbered cell source lines and odd-numbered cell source lines, the first bit line-side selection transistors are arranged on the same row as the second cell source line-side selection transistors, the first cell source line-side selection transistors are arranged on the same row as the second bit line-side selection transistors, and the first memory cell transistors are arranged on the same row as the second memory cell transistors.

13. The device according to claim 12, wherein the even-numbered cell source lines and odd-numbered cell source lines intersect the even-numbered bit lines and odd-numbered bit lines.

14. The device according to claim 13, wherein the even-numbered bit lines and odd-numbered bit lines are arranged above the even-numbered cell source lines and odd-numbered cell source lines.

15. The device according to claim 14, wherein the other end of the current path of each of the first bit line-side selection transistors is electrically connected to a corresponding one of even-numbered local internal wirings via a first plug, the even-numbered local internal wiring is electrically connected to the even-numbered bit line via a second plug, the other end of the current path of each of the second cell source line-side selection transistors is electrically connected to a corresponding one of the odd-numbered cell source lines via a third plug, the other end of the current path of each of the second bit line-side selection transistors is electrically connected to a corresponding one of odd-numbered local internal wirings via a fourth plug, the odd-numbered local internal wiring is electrically connected to the odd-numbered bit line via a fifth plug, and the other end of the current path of each of the first cell source line-side selection transistors is electrically connected to a corresponding one of the even-numbered cell source lines via a sixth plug.

16. The device according to claim 15, wherein the even-numbered cell source lines and odd-numbered cell source lines are arranged on the same plane as the even-numbered local internal wirings and odd-numbered local internal wirings, the odd-numbered cell source line includes an odd-numbered in-bit local portion extending in a direction parallel to the even-numbered local internal wirings and an odd-numbered bit-common portion extending in a direction which intersects the even-numbered local internal wirings, and the even-numbered cell source line includes an even-numbered in-bit local portion extending in a direction parallel to the odd-numbered local internal wirings and an even-numbered bit-common portion extending in a direction which intersects the odd-numbered local internal wirings.

17. The device according to claim 16, wherein the even-numbered bit-common portion and odd-numbered bit-common portion have mesh-form opening patterns.

18. The device according to claim 16, wherein the odd-numbered bit-common portions are arranged above the first and second memory cell transistors.

19. A data programming method for a semiconductor integrated circuit device which includes even-numbered bit lines, odd-numbered bit lines, cell source lines, first memory elements electrically connected between the even-numbered bit lines and the cell source lines, and second memory elements electrically connected between the odd-numbered bit lines and the cell source lines and belonging to the same rows as the first memory elements, comprising:

applying a potential corresponding to data to be programmed to the first memory element via the even-numbered bit line and applying a potential which suppresses programming to the second memory element via the cell source line while the odd-numbered bit lines are kept in an electrically floating state when data is programmed into the first memory element, and applying a potential corresponding to data to be programmed to the second memory element via the odd-numbered bit line and applying a potential which suppresses programming to the first memory element via the cell source line while the even-numbered bit lines are kept in an electrically floating state when data is programmed into the second memory element.

20. The data programming method according to claim 19, wherein the first memory element is a first NAND string, the second memory element is a second NAND string, the first NAND string includes a first bit line-side selection transistor, a first cell source line-side selection transistor and at least one first memory cell transistor serially connected between one end of a current path of the first bit line-side selection transistor and one end of a current path of the first cell source line-side selection transistor, the second NAND string includes a second bit line-side selection transistor, a second cell source line-side selection transistor and at least one second memory cell transistor serially connected between one end of a current path of the second bit line-side selection transistor and one end of a current path of the second cell source line-side selection transistor, the first bit line-side selection transistor and second cell source line-side selection transistor are driven by a first common selection gate signal, the first cell source line-side selection transistor and second bit line-side selection transistor are driven by a second common selection gate signal, and the first and second memory cell transistors are driven by a common row selection signal.

* * * * *